(12) United States Patent
Ohta

(10) Patent No.: US 8,901,587 B2
(45) Date of Patent: Dec. 2, 2014

(54) DISPLAY PANEL APPARATUS AND MANUFACTURING METHOD OF DISPLAY PANEL APPARATUS

(75) Inventor: Takashi Ohta, Kyoto (JP)

(73) Assignee: Panasonic Corporation, Osaka (JP)

( * ) Notice: Subject to any disclaimer, the term of this patent is extended or adjusted under 35 U.S.C. 154(b) by 199 days.

(21) Appl. No.: 13/476,378

(22) Filed: May 21, 2012

(65) Prior Publication Data

US 2012/0223873 A1 Sep. 6, 2012

Related U.S. Application Data

(63) Continuation of application No. PCT/JP2010/002346, filed on Mar. 31, 2010.

(51) Int. Cl.
*G09G 3/30* (2006.01)
*H01L 51/52* (2006.01)
*H01L 27/32* (2006.01)

(52) U.S. Cl.
CPC ........ *H01L 51/5275* (2013.01); *H01L 27/3211* (2013.01); *H01L 51/524* (2013.01)
USPC ............... 257/98; 438/29; 438/486; 438/158; 438/57; 438/689

(58) Field of Classification Search
USPC ............................ 257/98, E33.06, 100, 40, 57
See application file for complete search history.

(56) References Cited

U.S. PATENT DOCUMENTS

| 2004/0100700 | A1* | 5/2004 | Kitamura et al. ............. 359/622 |
| 2005/0002094 | A1 | 1/2005 | Yamashita et al. |
| 2006/0203333 | A1 | 9/2006 | Yamashita et al. |

FOREIGN PATENT DOCUMENTS

| JP | 11-074072 | 3/1999 |
| JP | 2004-039500 | 2/2004 |
| JP | 2004-317732 | 11/2004 |
| JP | 2005-148475 | 6/2005 |
| JP | 2006-196197 | 7/2006 |
| JP | 2007-207656 | 8/2007 |
| JP | 2008-152038 | 7/2008 |

OTHER PUBLICATIONS

International Search Report in PCT/JP2010/002346, dated Jul. 6, 2010.

* cited by examiner

*Primary Examiner* — Chuong A Luu
*Assistant Examiner* — Rodolfo Fortich
(74) *Attorney, Agent, or Firm* — Greenblum & Bernstein, P.L.C.

(57) ABSTRACT

A display panel apparatus includes a substrate and an organic electro-luminescence unit that includes an array. The array is above the substrate and includes a red, a green, and a blue pixel. A glass layer is above the organic electro-luminescence unit. A resin layer is between the glass layer and the organic electro-luminescence unit. A surface of the resin layer that is on a side toward the organic electro-luminescence unit includes concaves. Each of the concaves is concaved toward the glass layer and corresponds to one of the pixels. Lens resins are each in one of the concaves and include a surface that is substantially coplanar with the surface of the resin layer. A refractive index of the lens resin in the concave that corresponds to the blue pixel is greater than a refractive index of the lens resin in the concave that corresponds to the red pixel.

15 Claims, 31 Drawing Sheets

| [nH$_R$] | | 1.35 | 1.4 | 1.45 | 1.5 |
|---|---|---|---|---|---|
| | 1.5 | 1.79 | 1.73 | 1.68 | 1.63 |
| | 1.6 | 1.92 | 1.86 | 1.79 | 1.74 |
| | 1.7 | 2.04 | 1.97 | 1.92 | 1.86 |
| | 1.8 | 2.12 | 2.09 | 2.04 | 1.97 |
| | 1.9 | 2.15 | 2.15 | 2.12 | 2.07 |

| [nH$_G$] | | 1.35 | 1.4 | 1.45 | 1.5 |
|---|---|---|---|---|---|
| | 1.5 | 1.10 | 1.06 | 1.03 | 1.00 |
| | 1.6 | 1.18 | 1.14 | 1.10 | 1.07 |
| | 1.7 | 1.25 | 1.21 | 1.18 | 1.14 |
| | 1.8 | 1.30 | 1.28 | 1.25 | 1.21 |
| | 1.9 | 1.32 | 1.32 | 1.30 | 1.27 |

| [nH$_B$] | | 1.35 | 1.4 | 1.45 | 1.5 |
|---|---|---|---|---|---|
| | 1.5 | 1.10 | 1.06 | 1.03 | 1.00 |
| | 1.6 | 1.18 | 1.14 | 1.10 | 1.07 |
| | 1.7 | 1.25 | 1.21 | 1.18 | 1.14 |
| | 1.8 | 1.30 | 1.28 | 1.25 | 1.21 |
| | 1.9 | 1.32 | 1.32 | 1.30 | 1.27 |

DISPLAY PANEL APPARATUS AND MANUFACTURING METHOD OF DISPLAY PANEL APPARATUS

CROSS REFERENCE TO RELATED APPLICATION

This is a continuation application of PCT Application No. PCT/JP2010/002346 filed on Mar. 31, 2010, designating the United States of America, the disclosure of which, including the specification, drawings and claims, is incorporated herein by reference in its entirety.

BACKGROUND OF THE INVENTION

1. Field of the Invention

The present invention relates to a display panel apparatus and a manufacturing method of the display panel apparatus, and particularly relates to a display panel apparatus with an organic luminescent layer and a manufacturing method thereof.

2. Description of the Related Art

In recent years, self-luminous display panel apparatus such as display panel apparatus having organic Electro-Luminescence (EL) device has been attracting attention. The display panel apparatus including the organic EL device includes a red pixel unit including a red organic luminescent layer which emits red light, a green pixel unit including a green organic luminescent layer which emits green light, and a blue pixel unit including a blue organic luminescent layer which emits blue light.

It is important for the display panel apparatus having the organic EL device to increase extraction efficiency of light emitted from the organic luminescent layer in each color.

Conventionally, a display panel apparatus in which microlenses are provided above the pixel unit in each color has been proposed in order to increase the extraction efficiency of light emitted from the organic luminescent layer (for example, see Patent Literature 1: Japanese Unexamined Patent Application Publication 2007-207656 and Patent Literature 2: Japanese Unexamined Patent Application Publication No. 11-74072).

In the conventional display panel apparatus, the light emitted from the organic luminescent layer is condensed using a difference in refractive indices of the microlens and a resin layer contacting the microlens.

SUMMARY OF THE INVENTION

Conventional microlenses are composed of a lens sheet which includes a sheet-shaped lens base and lenses formed thereon. The lens sheet has uniformly formed lenses and lens base made of the same lens resin. Accordingly, the refractive indices of lenses corresponding to the pixel units are identical.

However, the wavelengths of the red, green, and blue light emitted from the organic luminescent layer differ due to their properties. Thus, when the refractive index of the lens for each color is identical, the light-extraction efficiencies from the red pixel unit, the green pixel unit, and the blue pixel unit are not equal. As a result, the light-extraction efficiency in each pixel unit differs.

The present invention has been conceived in order to solve the problems mentioned above, and it is an object of the present invention to provide a display panel apparatus which reduces the difference in the light-extraction efficiency of the pixel units in different colors, and suppress variation in the life of the pixel units and a manufacturing method thereof.

In order to solve the problems described above, an aspect of the display panel apparatus according to the present invention is a display panel apparatus which includes: a substrate; an organic electro-luminescence (EL) unit including, above the substrate, an array of a first pixel unit which emits red light, a second pixel unit which emits green light, and a third pixel unit which emits blue light; a glass layer arranged above the organic EL unit; a resin layer (i) interposed between the glass layer and the organic EL unit and (ii) including concaves formed in a surface of the resin layer on a side toward the organic EL unit, each of which corresponds to each of the first pixel unit, the second pixel unit, and the third pixel unit, and is recessed toward the glass layer; and a lens resin filled into each of the concaves up to a substantially same level as the surface of the resin layer on the side toward the organic EL unit, in which a refractive index of a lens resin filled into a concave in the resin layer corresponding to the third pixel unit is higher than at least a refractive index of a lens resin filled into a concave in the resin layer corresponding to the first pixel unit.

According to the display panel apparatus of the present invention, the refractive index of the lens resin corresponding to the third pixel unit can be optimized with respect to the refractive index of the resin layer. Thus, it is possible to make the light-extraction efficiency from the third pixel unit closer to the light-extraction efficiency from the first pixel unit. Thus, it is possible to reduce the amount of voltage to be applied to the third pixel unit compared to the conventional technology, thereby reducing the consumption power of the third pixel unit. Therefore, it is possible to prevent the life of the third pixel unit from shortening, thereby suppressing a variation between life of the first pixel unit and the third pixel unit.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 5A is a chart illustrating the light-extraction efficiency to the refractive indices of the lens for red and the refractive indices of the resin layer in the display panel apparatus according to the first embodiment of the present invention;

FIG. 5B is a chart illustrating the light-extraction efficiency to the refractive indices of the lens for green and the refractive indices of the resin layer in the display panel apparatus according to the first embodiment of the present invention;

FIG. 5C is a chart illustrating the light-extraction efficiency to the refractive indices of the lens for blue and the refractive indices of the resin layer in the display panel apparatus according to the first embodiment of the present invention;

DESCRIPTION OF THE PREFERRED EMBODIMENT(S)

Figure 1:
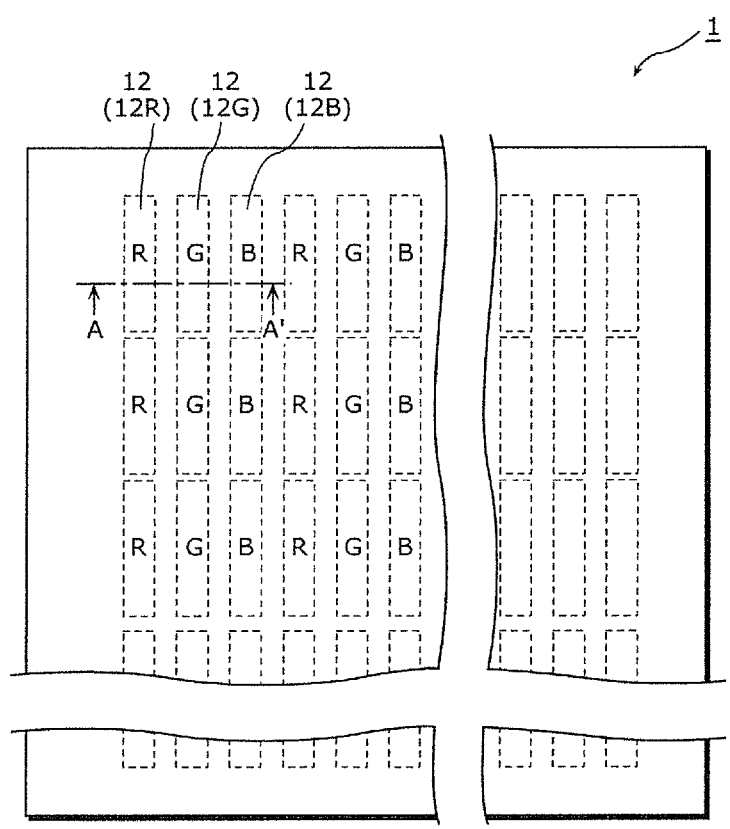
FIG. 1 is a planar view of a display panel apparatus according to the first embodiment of the present invention.

As described above, in the conventional display panel apparatus, the refractive indices of the microlenses corresponding to the pixel units are identical, although the properties of the red light, the green light, the blue light emitted by the organic luminescent layer are different. Consequently, the light-extraction efficiencies from the red pixel unit, the green pixel unit, and the blue pixel unit are not equal. As a result, there is a problem that the light-extraction efficiency in each pixel unit differs.

Particularly, the organic material of the blue organic luminescent layer has lower luminescent efficiency compared to the organic material of other colors; that is, the extraction efficiency of light from the blue pixel unit is lower than the light-extraction efficiency of the pixel units in other colors.

Thus, for example, when the light-extraction efficiency of the blue pixel unit is lower than the light-extraction efficiency of the red pixel unit, the luminance of the light emitted from the blue pixel unit is lower than the luminance of the light emitted form the red pixel unit. In this case, when the same voltage is applied to the pixel units for producing luminescence at the organic luminescent layer, the extraction efficiency of the light from the blue pixel unit is not optimized.

Accordingly, in the conventional display panel apparatus, in order to display the image with a desired contrast, it is necessary for the blue pixel unit to apply a voltage larger than the voltage applied to the red pixel unit and to produce luminescence at the organic luminescent layer. This causes problems; namely, increased consumption power by the blue pixel unit and shortened life of the blue organic luminescent layer.

In order to solve the problems described above, in an aspect of the display panel apparatus according to the present invention, the display panel apparatus includes: a substrate; an organic electro-luminescence (EL) unit including, above the substrate, an array of a first pixel unit which emits red light, a second pixel unit which emits green light, and a third pixel unit which emits blue light; a glass layer arranged above the organic EL unit; a resin layer (i) interposed between the glass layer and the organic EL unit and (ii) including concaves formed in a surface of the resin layer on a side toward the organic EL unit, each of which corresponds to each of the first pixel unit, the second pixel unit, and the third pixel unit, and is recessed toward the glass layer; and a lens resin filled into each of the concaves up to a substantially same level as the surface of the resin layer on the side toward the organic EL unit, in which a refractive index of a lens resin filled into a concave in the resin layer corresponding to the third pixel unit is higher than at least a refractive index of a lens resin filled into a concave in the resin layer corresponding to the first pixel unit.

Thus, the refractive index of the lens resin corresponding to the third pixel unit is optimized with respect to the refractive index of the resin layer. Thus, compared to the case where the refractive index of the lens resin is identical among the pixel units, it is possible to make the light-extraction efficiency of the third pixel unit closer to the light-extraction efficiency of the first pixel unit. As a result, it is not necessary to increase the voltage to be applied to the third pixel unit to make the light-extraction efficiencies of the luminescent regions in three colors identical, thereby allowing the amount of voltage to be applied to the third pixel unit to be small. Therefore, it is possible to reduce the consumption power of the third pixel unit. Furthermore, since it is possible to reduce the voltage to be applied to the third pixel unit, the degradation in the third pixel unit can be suppressed, thereby preventing the life of the third pixel unit from shortening.

In addition, in an aspect of the display panel apparatus according to the present invention, it is preferable to include a second resin layer for bonding the organic EL unit and the resin layer, the second resin layer being provided between the organic EL unit and the resin layer, in which the lens resin protrudes toward the glass layer from a plane at a same level as a surface of the second resin layer bonded with the resin layer.

The lens used for the conventional display panel apparatus is formed on the sheet-shaped lens base, and the lenses and the lens base are formed as one. In addition, the base material for reinforcing the lens base was provided at the bottom surface of the lens sheet considering the manufacturing process.

In these embodiments, the lens resin protrudes toward the glass layer from a plane at a same level as a surface of the second resin layer bonded with the resin layer. Thus, the second resin layer serves as the base and the base material provided for the conventional lens sheet, thereby reducing the base and the base material. Consequently, it is possible to make the layers between the glass substrate and the pixel units thinner, thereby improving the light-extraction efficiency.

In addition, in an aspect of the display panel apparatus according to the present invention, it is preferable that a refractive index of the lens resin filled into the concave in the resin layer corresponding to the second pixel unit is higher than a refractive index of the lens resin filled into the concave in the resin layer corresponding to the first pixel unit.

With this, the refractive index of the lens resin corresponding to the second pixel unit is optimized. Thus, it is possible to make the light-extraction efficiency from the second pixel unit closer to the light-extraction efficiency from the first pixel unit, compared to the case where the refractive index of the lens resin is identical for the pixel units. As a result, it is not necessary to increase the voltage to be applied to the second pixel unit to make the light-extraction efficiencies of the luminescent regions in three colors identical, thereby allowing the amount of voltage to be applied to the second pixel unit to be small. Therefore, it is possible to reduce the consumption power of the second pixel unit. Furthermore, since it is possible to reduce the voltage to be applied to the second pixel unit, the degradation in the second pixel unit can be suppressed, thereby preventing the life of the second pixel unit from shortening.

In addition, in an aspect of the display panel apparatus according to the present invention, it is preferable that the refractive index of the lens resin filled into the concave in the resin layer corresponding to the third pixel unit is identical to the refractive index of the lens resin filled into the concave in the resin layer corresponding to the second pixel unit.

With this, it is possible to make the light-extraction efficiencies from the second pixel unit and the third pixel unit closer to the light-extraction efficiency from the first pixel unit.

In addition, in an aspect of the display panel apparatus according to the present invention, it is preferable that refractive indices of lens resins filled into the concaves are equal to or higher than a refractive index of the resin layer.

This allows the improvement in the light-extraction efficiency.

In addition, in an aspect of the display panel apparatus according to the present invention, it is preferable that the refractive index of the resin layer is between 1.3 and 1.5 inclusive, the refractive index of the lens resin filled into the concave in the resin layer corresponding to the first pixel unit is 1.5, the refractive index of the lens resin filled into the concave in the resin layer corresponding to the second pixel unit is 1.9, and the refractive index of the lens resin filled into the concave in the resin layer corresponding to the third pixel unit is 1.9.

With this, it is possible to make the light-extraction efficiencies from the second pixel unit and the third pixel unit closest to the light-extraction efficiency from the first pixel unit.

In addition, in an aspect of the display panel apparatus according to the present invention, it is preferable that the lens resin is in contact with a lower surface of the glass layer.

This allows the distance between the glass layer and the organic EL unit to be thinnest, further increasing the light-extraction efficiency.

In addition, in an aspect of the display panel apparatus according to the present invention, it is preferable that the resin layer further includes a second concave provided between the concaves and recessed toward the glass layer, and a black partition is provided by filling the second concave up to a substantially same level as the surface of the resin layer on the side toward the organic EL unit.

With this, the black partition absorbs the light reflected on the lines in the organic EL unit, reducing the reflected light that exits to outside of the display panel apparatus. As a result, it is possible to suppress the discoloration due to the reflected light when viewing the display panel apparatus.

In addition, in an aspect of the display panel apparatus according to the present invention, it is preferable that a depth of the second concave is at least deeper than a depth of the concaves.

With this, it is possible to make the height of the black partition higher than the height of the lens resin, and thus, it is possible to increase the area in which the reflected light from the lines in the organic EL unit is absorbed. Therefore, it is possible to further reduce the reflected light that exits to outside of the display panel apparatus.

In addition, in an aspect of the display panel apparatus according to the present invention, it is preferable that the substrate or the organic EL unit has an alignment mark for aligning the substrate and the concaves, the resin layer further includes a recess formed along a perimeter of the concave and protruding toward the organic EL unit, and the recess is used for alignment with the alignment mark.

With this, the light that entered the recess from the glass layer reflects in the tilted surface of the recess and exits to the glass layer again. Thus, it is possible to optically recognize the recess clearly from the glass layer side during the manufacturing process of the display panel apparatus. As such, the recess is used as the alignment marks on the resin layer side for aligning the concaves on the resin layer and the alignment mark, thereby allowing highly precise alignment.

In addition, in an aspect of the display panel apparatus according to the present invention, the glass layer composes an outer surface of the display panel apparatus.

This allows the display panel apparatus to have the glass layer as the outer surface.

In addition, in an aspect of the display panel apparatus according to the present invention, it is preferable to include a sealing layer interposed between the organic EL unit and the second resin layer, and is for sealing the first pixel unit, the second pixel unit, and the third pixel unit.

With this, in the manufacturing process of the display panel apparatus, it is possible to prevent moisture and outgas such as oxygen from being mixed into the first pixel unit, the second pixel unit, and the third pixel unit after the first pixel unit, the second pixel unit, and the third pixel unit are formed.

In addition, in an aspect of the display panel apparatus according to the present invention, it is preferable that each of the concaves is elongated in top view and has an elliptic arc shape with a predetermined curvature factor in cross-section orthogonal to a longitudinal direction of the lens, and the concave is filled with the lens resin.

With thus, the shape of the lens resin may be a lenticular lens with the above-described shape.

Furthermore, in another aspect of the display panel apparatus according to the present invention, it is preferable to include an organic electro-luminescence (EL) unit including an array of a first pixel unit which emits red light, a second pixel unit which emits green light, and a third pixel unit which emits blue light; a glass layer including concaves formed in a surface of the glass layer on a side toward the organic EL unit, each of which corresponds to each of the first pixel unit, the second pixel unit, and the third pixel unit, and is recessed toward the glass layer; and a lens resin filled into each of the concaves up to a substantially same level as the surface of the glass layer on the organic EL unit, in which a refractive index of a lens resin filled into a concave in the glass layer corresponding to the third pixel unit is higher than at least a refractive index of a lens resin filled into a concave in the glass layer corresponding to the first pixel unit.

With this, the refractive index of the lens resin corresponding to the third pixel unit is optimized. Thus, it is possible to make the light-extraction efficiency from the third pixel unit closer to the light-extraction efficiency from the first pixel unit, compared to the case where the refractive index of the lens resin is identical for the pixel units. As a result, it is not necessary to increase the voltage to be applied to the third pixel unit to make the light-extraction efficiencies of the luminescent regions in three colors identical, thereby allowing the amount of voltage to be applied to the third pixel unit to be small. Therefore, it is possible to reduce the consumption power of the third pixel unit. Furthermore, since it is possible to reduce the voltage to be applied to the third pixel unit, the degradation in the third pixel unit can be suppressed, thereby preventing the life of the third pixel unit from shortening.

Furthermore, the lens resin can be directly formed on the glass layer. This eliminates the necessity for providing the resin layer for bonding the lens resin and the glass layer. Therefore, it is possible to make the thickness of the entire display panel apparatus thinner, and reducing the manufacturing cost as well. In addition, the light-extraction efficiency can be increased since the resin layer is not formed.

In an aspect of the display apparatus according to the present invention, it is preferable to include the display panel apparatus, in which the first pixel unit, the second pixel unit, and the third pixel unit are arranged in a matrix.

With this, it is possible to achieve the display apparatus in which the first pixel units, the second pixel units, and the third pixel units are arranged in a matrix.

Furthermore, an aspect of the manufacturing method of the display panel apparatus according to the present invention includes: a first process of preparing an organic electro-luminescence (EL) unit including an array of a first pixel unit which emits red light, a second pixel unit which emits green light, and a third pixel unit which emits blue light; a second process of forming a resin layer on a surface of a glass substrate; a third process of forming concaves in a surface of the resin layer on a side opposite to a side bonded with the glass substrate, each of which corresponds to each of the first pixel unit, the second pixel unit, and the third pixel unit, and is recessed toward the glass substrate; a fourth process of filling the concaves with a lens resin such that a surface of the lens resin is at a substantially same level as the surface of the resin layer on the side opposite to the side bonded with the glass substrate; and a fifth process of bonding, with a second resin layer including an adhesive interposed in between, the organic EL unit and the surface of the resin layer in which the concaves are formed, in which, in the fourth process, a concave in the resin layer corresponding to the third pixel unit is filled with a lens resin having a refractive index higher than at least a refractive index of a lens resin filled into a concave in the resin layer corresponding to the first pixel unit.

With this, the lenses are formed by filling the lens resin into the concaves formed on the resin layer. Thus, the resin layer which is part of the material comprising the display panel apparatus may serve as a metallic mold for forming the lenses and serve for planarizing the irregularity on the lenses.

Furthermore, the lenses may be formed directly on the concaves formed in the resin layer. Thus, it is possible to form lenses corresponding to the first pixel unit, the second pixel unit, and the third pixel unit independently. As a result, the lenses can be formed using the lens resins which are most suitable for the pixel units, respectively, optimizing the light-extraction efficiencies of the pixel units.

In addition, when filling the lens resin into each concaves provided in the resin layer, the lens resin is filled up to a substantially same level as the surface of the resin layer on a side opposite to a side bonded with the resin layer. With this, the lens resin is filled into the concaves without space, thereby preventing the reduction in the characteristics of the lens caused by the space in the concaves.

In addition, in an aspect of the manufacturing method of the display panel apparatus according to the present invention, in the fourth process, when filling the concaves with the lens resin, it is preferable that the surface of the resin layer on which the lens resin is filled is planarized by filling the lens resin in the concave to overflow on the surface of the resin layer and subsequently scraping the lens resin at a level above the surface of the resin layer.

With this, it is possible to fill the lens resin into the concaves formed in the resin layer without space, and form the lenses along with the shape of the concaves. Therefore, it is possible to prevent the characteristics of the lens from reducing due to the space in the concaves or the shape of the lens differing from the designed value. As a result, it is possible to prevent the reduction in the light-extraction efficiency.

In addition, scraping the lens resin overflowing the surface of the resin layer planarizes the surface of the resin layer into which the lens resin is filled, thereby allowing the organic EL unit and the resin layer bonded at high precision.

Furthermore, another aspect of the manufacturing method of the display panel apparatus according to the present invention includes a first process of preparing an organic electroluminescence (EL) unit including an array of a first pixel unit which emits red light, a second pixel unit which emits green light, and a third pixel unit which emits blue light; a second process of forming concaves in a surface of a glass substrate, each of which is corresponding to each of the first pixel unit, the second pixel unit, and the third pixel unit, and is recessed toward the glass layer; a third process of filling the concaves with a lens resin such that a surface of the lens resin is at a substantially same level as a reference plane of a side of the glass substrate opposite to a side toward which the concaves are recessed; and a fourth process of bonding, with a resin layer including an adhesive in between, the organic EL unit and the surface of the glass substrate in which the concaves are formed, and in which, in the third process, a concave in the glass substrate corresponding to the third pixel unit is filled with a lens resin having a refractive index higher than at least a refractive index of a lens resin filled into a concave in the glass substrate corresponding to the first pixel unit.

With this, the lenses are formed by filling the lens resin into the concaves formed in the glass substrate. Thus, the resin layer may serve as a metallic mold for forming the lenses on the glass substrate which is part of the material composing the display panel apparatus, and serve for planarizing the irregularity on the lenses.

Furthermore, the lenses may be formed directly on the concaves formed in the glass substrate. Thus, it is possible to form lenses corresponding to the first pixel unit, the second pixel unit, and the third pixel unit independently. As a result, the lenses can be formed using the lens resins which are most suitable for the pixel units, respectively, optimizing the light-extraction efficiencies of the pixel units.

In addition, when filling the lens resin into each of the concaves in the glass substrate, the lens resin is filled up to a substantially same level as a reference plane of a side of the glass substrate opposite to a side toward which the concaves are recessed. With this, the lens resin is filled into the concaves without space, thereby preventing the reduction in the characteristics of the lens caused by the space in the concaves.

Furthermore, by directly forming the lens resin on the glass substrate, it is not necessary to provide the resin layer for bonding the lens resin and the glass substrate. Therefore, it is possible to reduce the manufacturing cost.

The following describes the display panel apparatus and the manufacturing method of the display panel apparatus according to embodiments of the present invention with reference to the drawings.

First Embodiment

First, the following describes the display panel apparatus 1 according to the first embodiment of the present invention. FIG. 1 is a planar view of the display panel apparatus 1 according to the first embodiment of the present invention.

The display panel apparatus 1 according to the first embodiment of the present invention includes luminescent regions (not illustrated) formed in a row direction and a column direction orthogonal to the row direction (in a matrix). The luminescent regions include a luminescent pixel unit (hereafter simply referred to as "pixel unit") 12 for each luminescent region, as illustrated in FIG. 1. Thus, the pixel units 12 are arranged in the row direction and the column direction orthogonal to the row direction along the luminescent regions.

Each pixel unit 12 includes a pixel unit 12R which emits red light (hereafter referred to as "red pixel unit", a pixel unit 12G which emits green light (hereafter referred to as "green pixel unit"), and a pixel unit 12B (hereafter referred to as "blue pixel unit") which emits blue light. The pixel units 12 which emit the light in the same color are repeatedly arranged in the column direction. In the row direction, the red pixel units 12R, the green pixel units 12G, and the blue pixel units 12B are repeatedly arranged in this order.

Figure 2:
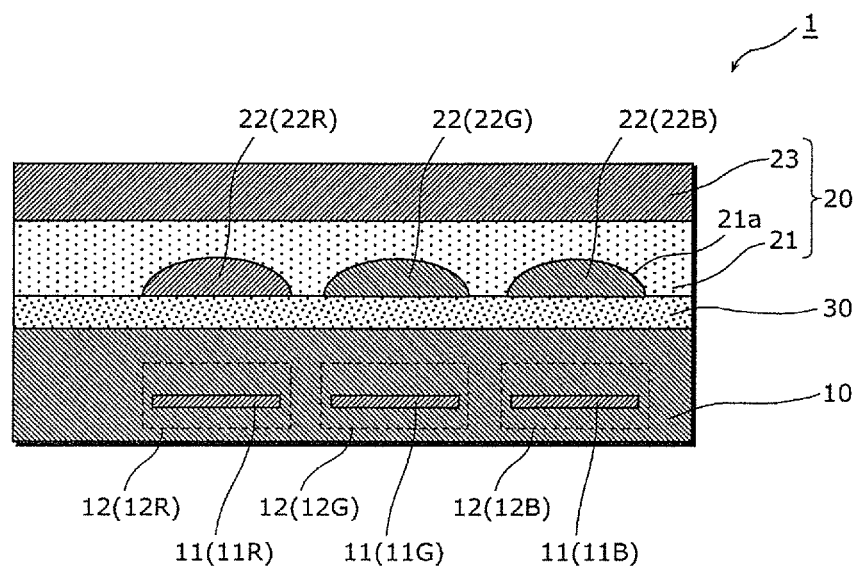
FIG. 2 is a schematic cross-section of the display panel apparatus according to the first embodiment of the present invention along the line A-A' illustrated in FIG. 1.

FIG. 2 is a schematic cross-section of a display panel apparatus according to the first embodiment of the present invention along the line A-A' illustrated in FIG. 1.

As shown in FIG. 2, the display panel apparatus 1 according to the first embodiment of the present invention has the organic EL unit 10 and the lens unit 20 bonded by a sealing resin 30.

The organic EL unit 10 includes the organic luminescent layer 11 which emits predetermined light, and includes an organic luminescent layer 11R which emits red light (hereafter referred to as "red organic luminescent layer"), an organic luminescent layer 11G which emits green light (hereafter referred to as "green organic luminescent layer"), and an organic luminescent layer 11B which emits blue light (hereafter referred to as "blue organic luminescent layer"). In addition, the red organic luminescent layer 11R, the green organic luminescent layer 11G, and the blue organic luminescent layer 11B are included in the red pixel unit 12R, the green pixel unit 12G, and the blue pixel unit 12B, respectively. More detailed structure of the organic EL unit 10 shall be described later.

As illustrated in FIG. 2, the lens unit 20 includes a resin layer 21, lenses 22 and the glass layer 23 (glass substrate).

The resin layer 21 is formed on the glass layer 23 on a side toward the organic EL unit 10. The resin layer 21 can be formed of, for example, a resin made of acrylate monomer and fluoropolymer.

On a side of the resin layer 21 toward the organic EL unit 10, the concaves 21a recessed toward the glass layer 23 are formed. Each of the concaves 21a corresponds to one of the red pixel unit 12R, the green pixel unit 12G, and the blue pixel unit 12B.

The lenses 22 are formed by filling a predetermined lens resin into the concaves 21a of the resin layer 21. The resin for the lenses 22 is filled up to a substantially same level as the surface of the resin layer 21 on the side toward the organic EL unit 10. The lenses 22 includes the lens for red 22R (a lens resin for red) corresponding to the red pixel unit 12R, the lens for green 22G (a lens resin for green) corresponding to the green pixel unit 12G, and the lens for blue 22B (a lens resin for blue) corresponding to the blue pixel unit 12B.

The cross-section of the lens 22 has an elliptic arc shape with a predetermined curvature factor as shown in FIG. 2. The shape of the lenses 22 in a planar view of the display panel apparatus 1 is rectangular and elongated in the column direction. Thus, the lens 22 has a semi-cylindrical shape.

Note that, the lens 22 is arranged corresponding to one of the pixel units 12 in this embodiment. However, lenticular lens may also be used as a shared lens for the pixel units 12 of the same color formed in the column direction.

In the display panel apparatus 1 according to the first embodiment, the refractive index $nH_B$ of the lens for blue 22B is set to be higher than the refractive index $nH_R$ of the lens for red 22R. The refractive index $nH_G$ of the lens for green 22G is also set to be higher than the refractive index $nH_R$ of the lens for red 22R.

In this embodiment, the lens for red 22R is made of epoxy resin, and its refractive index $nH_R$ is $nH_R=1.5$. The lens for green 22G and the lens for blue 22B are made of multifunctional acrylate and inorganic particulate, and the refractive indices $nH_G$ and $nH_B$ are $nH_B=nH_G=1.9$.

In addition, the refractive index nL of the resin layer 21 is set to be smaller than the refractive indices of the refractive index $nH_R$ of the lens for red 22R, the refractive index $nH_G$ of the lens for green 22G, and the refractive index $nH_B$ of the lens for blue 22B. In other words, the refractive indices of the refractive index $nH_R$ of the lens for red 22R, the refractive index $nH_G$ of the lens for green 22G, and the refractive index $nH_B$ of the lens for blue 22B are set to be equal to or higher than the refractive index nL of the resin layer 21. In this embodiment, the resin layer 21 is made of the acrylate monomer and fluoropolymer and the refractive index nL is $nL=1.4$.

The glass layer 23 constitutes the outer surface of the display panel apparatus 1. In this embodiment, the refractive index $n_g$ of the glass layer 23 is set to be higher than the refractive index nL of the resin layer 21. For example, BK7 is used for the glass layer 23, and its refractive index $n_g$ is $n_g=1.5$.

Figure 3:
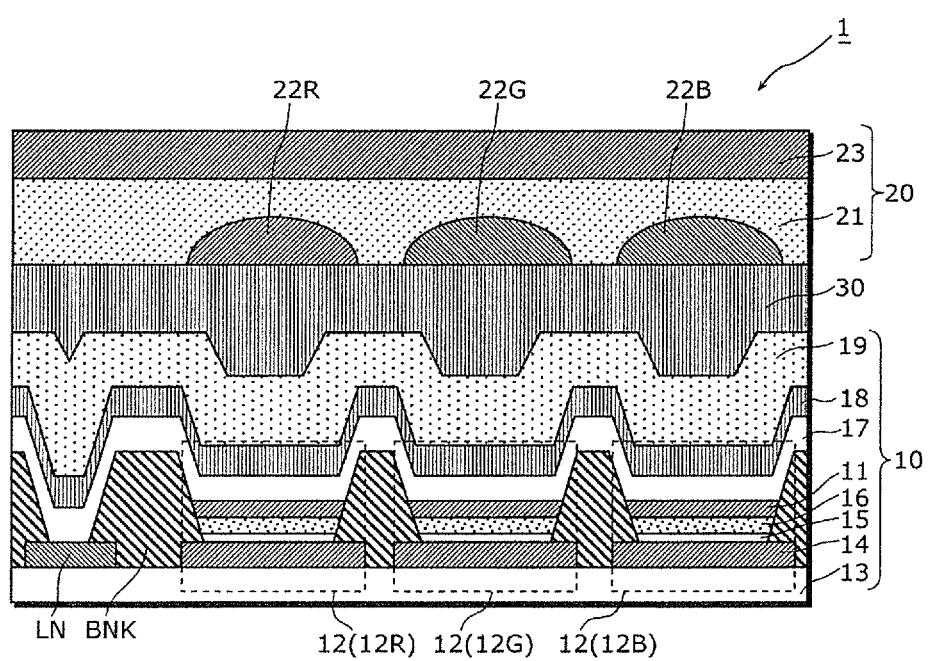
FIG. 3 is a cross-section of the display panel apparatus according to the first embodiment of the present invention along the line A-A' illustrated in FIG. 1 illustrating the detailed structure of the organic EL unit 10.

Next, the detailed structure of the organic EL units 10 in the display panel apparatus 1 according to this embodiment shall be described with reference to FIG. 3. FIG. 3 is a cross-section of the display panel apparatus according to the first embodiment of the present invention along the line A-A' illustrated in FIG. 1 illustrating the detailed structure of the organic EL unit 10, similar to FIG. 2.

As illustrated in FIG. 3, the organic EL unit 10 includes, for each pixel unit 12, a first electrode 14 (lower electrode), a hole injection layer 15, a hole transport layer 16, organic luminescent layer 11, an electron transport layer 17, a second electrode 18 (upper electrode) and a sealing thin-film 19 that are sequentially formed in this order on the substrate 13 on which a planarizing film (not illustrated) is formed.

The substrate 13 with the planarizing film is formed by forming the planarizing film for planarizing the top surface of a TFT layer (not illustrated) formed on the substrate 13.

The first electrode 14 is a repeller that serves as an anode, and a portion of the first electrode 14 is separately formed for each pixel unit. More specifically, the first electrode 14 is formed for each of the red pixel units 12R, the green pixel units 12G and the blue pixel units 12B.

The hole injection layer 15 is capable of injecting holes into the hole transport layer 16, and is made of a predetermined organic material. In addition, the hole transport layer 16 is capable of transporting holes to the organic luminescent layer, and is made of a predetermined organic material. The hole injection layer 15 and the hole transport layer 16 are separately formed for each pixel unit.

The electron transport layer 17 is capable of transporting electrons to the organic luminescent layer 11, and is made of a predetermined organic material.

The second electrode 18 is a transparent electrode that serves as a cathode, and is made of conductive material such as indium tin oxide (ITO), facing the first electrode 14. The second electrode 18 is shared by the pixel units 12.

The sealing thin-film 19 is a sealing layer for sealing the pixel units 12, and is made of thin-film transparent insulating material.

Note that, banks BNK for partitioning the first electrode 14, the hole injection layer 15, the hole transport layer 16, and the organic luminescent layer 11 are provided between the pixel units 12 in different color. The banks BNK are made of photosensitive resin. Lines LN are arranged on the substrate in the non-luminescent region in which the organic luminescent layer is not formed. Note that, in this embodiment, the banks BNK are formed only in the column direction in stripe. However, the banks BNK may also be formed in a grid for partitioning the pixel units 12 in the same color as well.

The following describes the effect of the display panel apparatus 1 according to the first embodiment of the present invention with the structure described above.

As described above, the display panel apparatus 1 according to the first embodiment has the refractive index $nH_B$ of the lens for blue 22B set to be higher than the refractive index $nH_R$ of the lens for red 22R. With this, the refractive index $nH_B$ of the lens for blue 22B is optimized to the refractive index nL of the resin layer 21. Thus, compared to the conventional example where the refractive indices of the lenses are identical, it is possible to make the light-extraction efficiency of the blue pixel unit 12B closer to the light-extraction efficiency of the red pixel unit 12R. As a result, it is not necessary to increase the voltage applied to the blue pixel unit 12B such that the light-extraction efficiency in the luminescent regions in three colors is identical. Therefore, it is possible to decrease the value of the voltage applied to the blue pixel unit 12B compared to the conventional technology. Therefore, it is possible to reduce the consumption power of the blue pixel unit 12B compared to the conventional technology. In addition, it is possible to reduce the voltage applied to the blue pixel unit 12B, thereby suppressing the degradation in the blue organic luminescent layer 11B and preventing the life of the blue organic luminescent layer 11B from shortening. Therefore, it is possible to suppress the variation of life between the blue pixel unit 12B and the red pixel unit 12R or the green pixel unit 12G.

The same also applies to the lens for green 22G. In the display panel apparatus 1 according to this embodiment, the refractive index $nH_G$ of the lens for green 22G is set to be higher than the refractive index $nH_R$ of the lens for red 22R. With this, the refractive index $nH_G$ of the lens for green 22G is optimized with respect to the refractive index nL of the resin layer 21. Thus, compared to the conventional technology where the refractive indices of the lenses are identical, it is possible to make the light-extraction efficiency of the green pixel unit 12G closer to the light-extraction efficiency of the red pixel unit 12R. As a result, it is not necessary to increase the value of the voltage applied to the green pixel unit 12G and can be set small compared to the conventional technology. Thus, it is possible to decrease the consumption power of the green pixel unit 12G. Furthermore, since the voltage applied to the green pixel unit 12G can be reduced, thereby preventing the reduction in the life of the green organic luminescent layer 11G in the same manner as the blue organic luminescent layer 11B. Therefore, it is possible to suppress the variation in the life between the green pixel unit 12G and the red pixel unit 12R or the blue pixel unit 12B.

Note that, in this embodiment, it is preferable to have the same refractive index for the refractive index $nH_B$ of the lens for blue 22B and the refractive index $nH_G$ of the lens for green 22G.

With this it is possible to make the light-extraction efficiency of the green pixel unit 12G and the blue pixel unit 12B closer to the red pixel unit 12R.

Furthermore, in the display panel apparatus 1 according to this embodiment, the lenses are formed by filling the lens resin into the concaves 21a formed in the resin layer 21 on a side toward the organic EL unit 10. With this, it is possible to independently form the lenses 22 corresponding to the red pixel unit 12R, the green pixel unit 12G, and the blue pixel unit 12B, instead forming lenses in a uniformed manner by filling the lens resin made of the same material into a metallic mold. Therefore, it is possible to form the lenses 22 for each color selecting the lens resin with a refractive index suitable for each pixel unit, thereby optimizing the light-extraction efficiency from the pixel unit 12 in each color.

In addition, in the display panel apparatus 1 according to this embodiment, the lens resin is filled into the concaves 21a of the resin layer 21 up to a substantially same level as the surface of the surface of the resin layer 21 on a side toward the organic EL unit 10. With this, the lens resin is filled into the concaves 21a without any space, thereby preventing the reduction in the characteristics of the lenses due to the space in the concaves 21a, and preventing the reduction in the light-extraction efficiency.

Furthermore, the lens used for the conventional display panel apparatus is formed on the sheet-shaped lens base, and the lenses and the lens base are formed as one. In addition, the base material for reinforcing the lens base was provided at the bottom surface of the lens sheet considering the manufacturing process.

In contrast, the display panel apparatus 1 according to this embodiment, each lens 22 is formed on the concave 21a in the resin layer 21, and the lens 22 is directly bonded to the sealing resin 30 for sealing the organic EL unit 10 and the lens unit 20.

Figure 4:
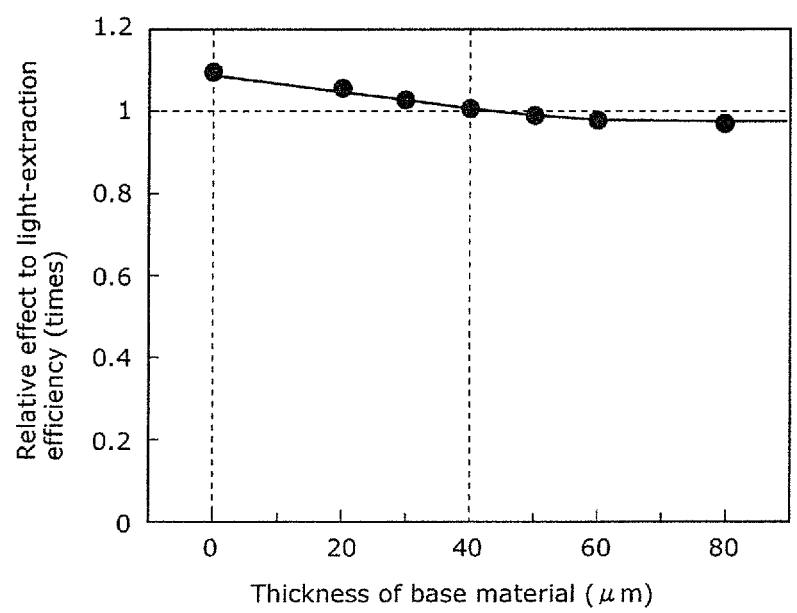
FIG. 4 illustrates the relative effect of the thickness of the base material to the light-extraction efficiency.

Thus, in this embodiment, it is not necessary to use the base as the base material as in the conventional technology, thereby allowing the layer between the glass layer and the pixel unit 12 to be thin. Therefore, the light-extraction efficiency can further be improved. The following describes this effect with reference to FIG. 4. FIG. 4 illustrates the relative effect of the thickness of the base material to the light-extraction efficiency. Note that, in FIG. 4, the reference is set to a case where the base material with the thickness of 40 µm is used (relative effect=1).

In the conventional display panel apparatus, the base material with the thickness of approximately 40 µm was used for reinforcing the lens sheet. In this embodiment, it is not necessary to use this base material, thereby improving the light-extraction efficiency for approximately 1.1 times.

Next, the result of comparing the light-extraction efficiency of the display panel apparatus 1 according to the first embodiment of the present invention by changing the refractive indices of the components shall be described with reference to FIGS. 5A to 5C. FIG. 5A illustrates the light-extraction efficiency with respect to the refractive index $nH_R$ of the lens for red 22R and the refractive index nL of the resin layer 21 in the display panel apparatus 1 according to the first embodiment of the present invention. FIGS. 5B and 5C illustrate the light-extraction efficiency with respect to the refractive index $nH_G$ of the lens for red 22R or the refractive index $nH_B$ of the lens for blue 22B and the refractive index nL of the resin layer 21 in the display panel apparatus 1 according to the first embodiment of the present invention.

As illustrated in FIGS. 5A to 5C, increasing the refractive index of the lens 22 increases the light-extraction efficiency in that color. In addition, setting the refractive index of the lens for red 22R to be small and the refractive index of the lens for blue 22B and the refractive index of the lens for green 22G to be large reduces the difference between the extraction efficiencies of the light in three colors. Note that, the light-extraction efficiency in FIGS. 5A to C can be calculated based on energy based on the wavelength of each color (E), the refractive index of each layer comprising the organic EL unit 10 (n), and an extinction coefficient of each layer comprising the organic EL unit 10 (k≈0). Note that the values of the light-extraction efficiency in FIGS. 5A to 5C are relative values.

Figure 6A:
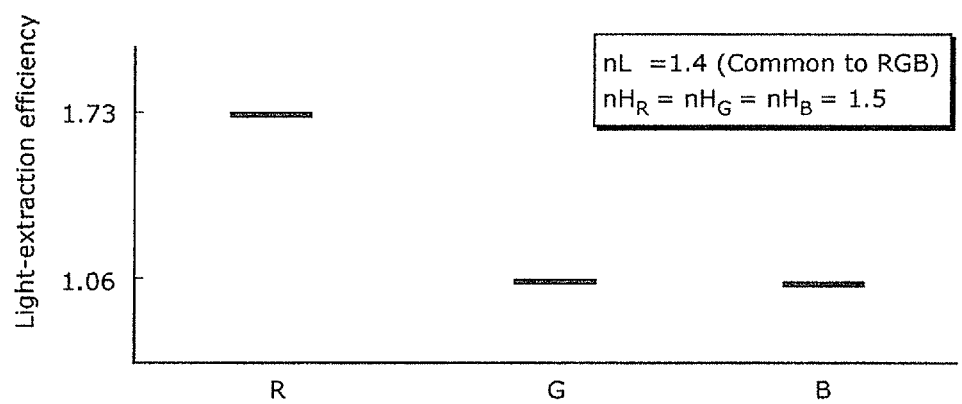
FIG. 6A illustrates the light-extraction efficiency at the conventional display panel apparatus.
Figure 6B:
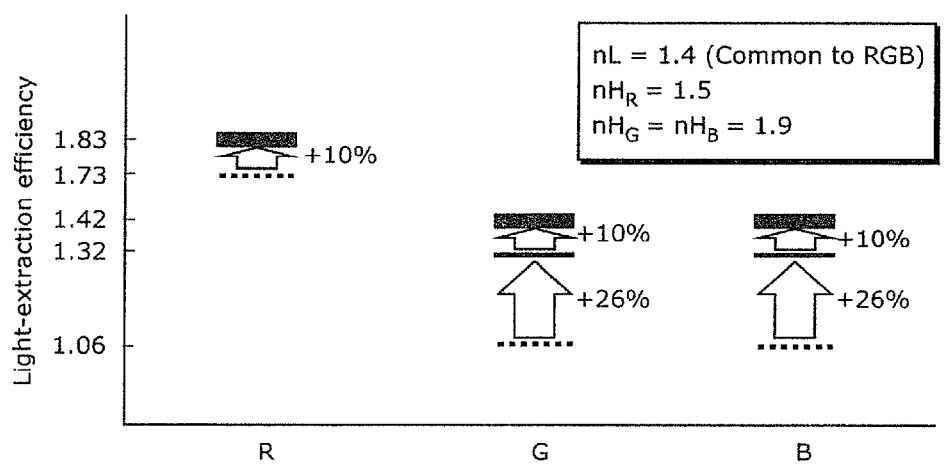
FIG. 6B illustrates the light-extraction efficiency at the display panel apparatus according to the first embodiment of the present invention.

Next, the effect of improving the light-extraction efficiency by the display panel apparatus 1 according to the first embodiment of the present invention shall be described with reference to FIGS. 6A and 6B. FIG. 6A illustrates light-extraction efficiencies in the conventional display panel apparatus. FIG. 6B illustrates the light-extraction efficiency in the display panel apparatus 1 according to the first embodiment of the present invention. Note that, in FIG. 6B the broken lines indicate the light-extraction efficiencies in the conventional display panel apparatus. The thin solid lines indicate the light-extraction efficiencies when the refractive indices of the lenses 22 are changed from the conventional display panel apparatus. The wide solid lines indicate light-extraction efficiencies obtained when changing the refractive indices of the lenses 22 and not using the base material. Note that the values of the light-extraction efficiency in FIGS. 6A and 6B are relative values.

The refractive indices of the lenses in the conventional display panel apparatus are identical, and the refractive index $nH_R$ of the lens for red, the refractive index $nH_G$ of the lens for green, and the refractive index $nH_B$ of the lens for blue is 1.5. The refractive index nL of the resin layer is 1.4. In this case, the light-extraction efficiency of the red pixel unit 12R is 1.73 as illustrated in FIG. 6A. Meanwhile, the light-extraction efficiency of the green pixel unit 12G and the blue pixel unit 12B is 1.06. Accordingly, in the conventional display panel apparatus, the difference between the extraction efficiency of light from the red pixel unit 12R and the extraction efficiency of light from the green pixel unit 12G or the blue pixel unit 12B is 0.67; that is, there is a significant difference in the light-extraction efficiencies. As described above, with the conventional display panel apparatus, there is a large variation in the light-extraction efficiency between the red pixel unit 12R and the green pixel unit 12G or the blue pixel unit 12B.

In contrast, in the display panel apparatus 1 according to this embodiment, the refractive index $nH_R$ of the lens for red 22R is 1.5, which is identical to the conventional technology, and the refractive index $nH_G$ of the lens for green 22G and the refractive index $nH_B$ of the lens for blue 22B are set at 1.9. The refractive index nL of the resin layer 21 is 1.4, which is the same as the conventional technology. In this case, as illustrated in FIG. 6B, the light-extraction efficiencies of the green pixel unit 12G and the blue pixel unit 12B increase to 1.32 from 1.06, improving light-extraction efficiency by 26%. In addition, with regard to the light-extraction efficiencies of the green pixel unit 12G and the blue pixel unit 12B, the difference from the light-extraction efficiency of the red pixel unit 12R is significantly decreased. Therefore, it is possible to decrease the difference in the light-extraction efficiency caused by difference in color, reducing the variation from the light-extraction efficiency of the red pixel unit 12R.

Furthermore, as described above, in the display panel apparatus 1 according to this embodiment does not have to use the base material for reinforcing the lens sheet. Thus, as illustrated in FIG. 6B, light-extraction efficiencies of the red pixel unit 12R, the green pixel unit 12G, and the blue pixel unit 12B can all be increased by 10%. Thus, the green pixel unit 12G and the blue pixel unit 12B can improve the light-extraction efficiency by 36%, in addition to the effect by changing the refractive indices as described above.

Next, the manufacturing method of the display panel apparatus 1 according to the first embodiment of the present invention shall be described using FIGS. 7A to 7G with reference to FIG. 3. FIGS. 7A to 7G are cross-sectional views of the components of the display panel apparatus 1 in each process of the manufacturing method of the display panel apparatus 1.

First, the organic EL unit 10 including an array of the red pixel unit 12R having the red organic luminescent layer 11R, the green pixel unit 12G having the green organic luminescent layer 11G, and the blue pixel unit 12B having the blue organic luminescent layer 11B are formed on the substrate 13 on which a planarizing film for planarizing the surface of the TFT layer is formed (step 11).

Figure 7A:
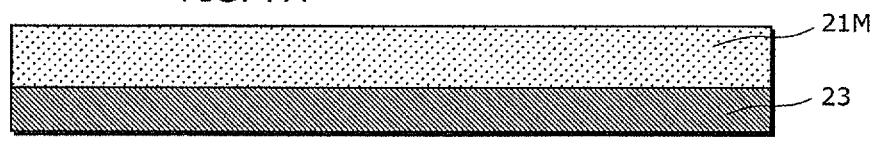
FIG. 7A is a cross-section of the components of the display panel apparatus in step 12 of the manufacturing method of the display panel apparatus according to the first embodiment.

Next, as illustrated in FIG. 7A, a resin film 21M is formed by painting predetermined resin material on the surface of the glass layer 23 which is the glass substrate (step 12). In this embodiment, BK7 with a refractive index of 1.5 is used for the glass substrate. A resin made of acrylate monomer and fluoropolymer with a refractive index of 1.4 is used for a resin film 21M.

Figure 7B:
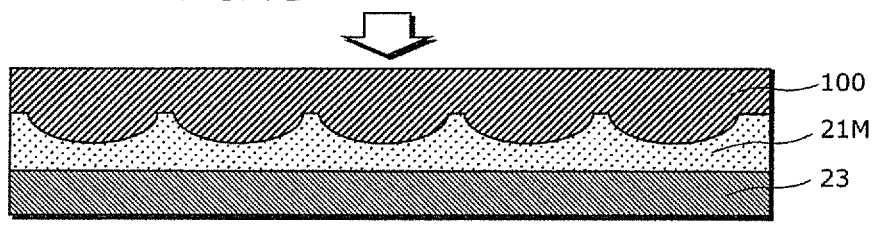
FIG. 7B is a cross-section of the components of the display panel apparatus in step 13 of the manufacturing method of the display panel apparatus according to the first embodiment of the present invention.
Figure 7C:
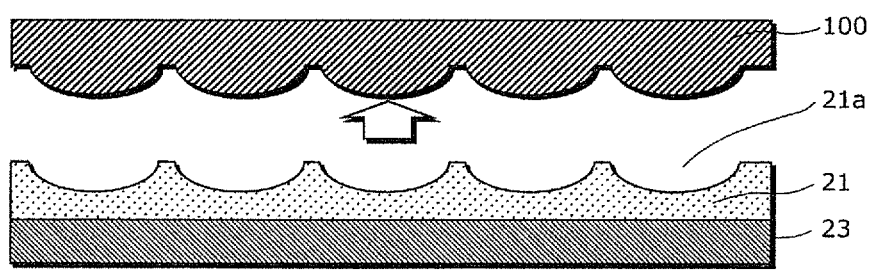
FIG. 7C is a cross-section of the components of the display panel apparatus in step 14 of the manufacturing method of the display panel apparatus according to the first embodiment of the present invention.

Next, as illustrated in FIG. 7B, the metallic mold 100 with convexes is pressed into the resin film 21M (step 13). In this embodiment, the gaps between the convexes of the metallic mold 100 are flat. Subsequently, as illustrated in FIG. 7C, the metallic mold 100 is removed from the resin film 21M after curing the resin film 21M (step 14). With this, the resin layer 21 including concaves 21a is formed.

The concaves 21a in the resin layer 21 is formed corresponding to the convexes of the metallic mold 100 and recessed toward the glass layer 23. The concaves 21a are formed to corresponding to the red pixel unit 12R, the green pixel unit 12G, and the blue pixel unit 12B.

Figure 7D:
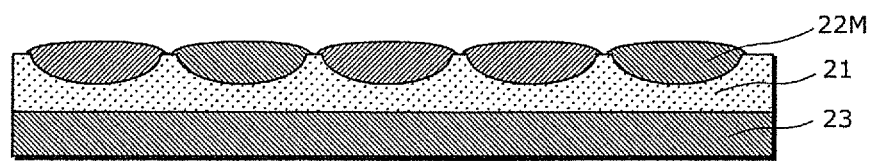
FIG. 7D is a cross-section of the components of the display panel apparatus in step 15 of the manufacturing method of the display panel apparatus according to the first embodiment of the present invention.

Next, as illustrated in FIG. 7D, a predetermined lens resin material 22M is filled into the concaves 21a (step 15). Here, the lens resin material 22M for the lens for red 22R is filled into the concaves 21a corresponding to the red pixel units 12R. The lens resin material 22M for the lens for green 22G and for the lens for blue 22B is filled into the concaves 21a corresponding to the green pixel units 12G and the blue pixel units 12B. In this embodiment, as described above, the epoxy resin with the refractive index of 1.5 is used for the lens resin material 22M for the lens for red 22R. The resin made of multifunctional acrylate and inorganic particulates and with the refractive index of 1.9 is used for the lens resin material 22M for the lens for green 22G and the lens for blue 22B.

Note that, when filling the lens resin material 22M in the concaves 21a, the lens resin material 22M is filled overflowing the surface of the resin layer 21, as illustrated in FIG. 7D. Subsequently, the lens resin material 22M is cured.

Figure 7E:
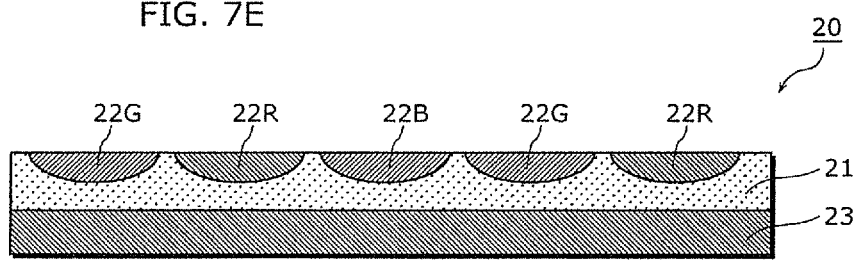
FIG. 7E is a cross-section of the components of the display panel apparatus according to the first embodiment of the present invention.

Next, the surface of the resin layer 21 on which the lens resin material 22M is filled is planarized by scraping the lens resin material 22M overflowing the resin layer 21 and at a level above the surface of the resin layer 21, as illustrated in FIG. 7E (step 16). With this, the surface of the lens resin material 22M and the surface of the resin layer 21 is substantially identical. As such, the lenses for red 22R, the lenses for green 22G, and the lenses for blue 22B buried in the resin layer 21 are formed. With the processes described above, the lens unit 20 is formed.

Figure 7F:
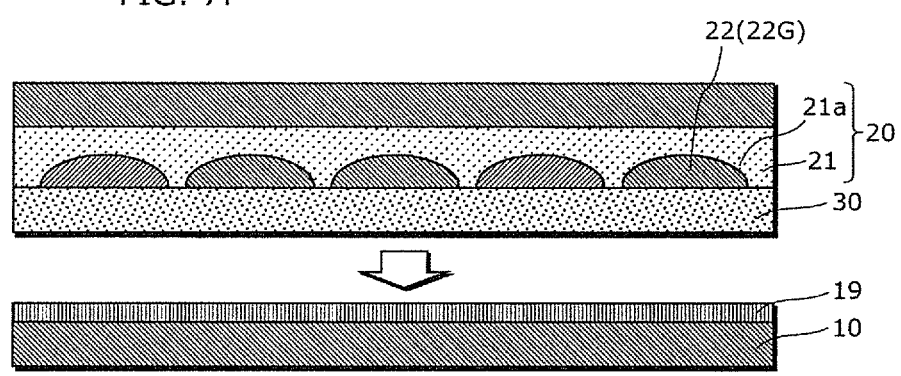
FIG. 7F is a cross-section of the components of the display panel apparatus in step 17 of the manufacturing method of the display panel apparatus according to the first embodiment of the present invention.
Figure 7G:
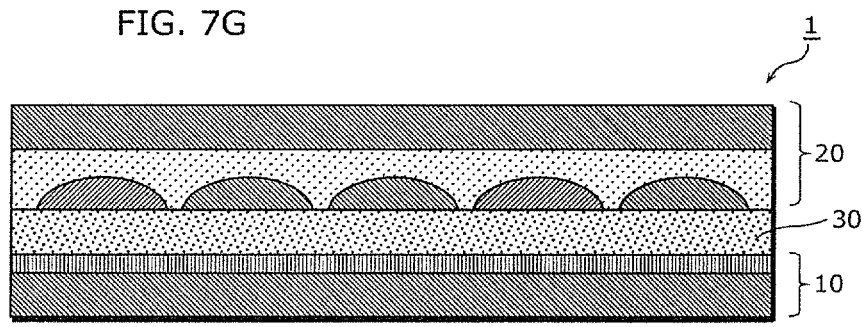
FIG. 7G is a cross-section of the display panel apparatus manufactured by the manufacturing method of the display panel apparatus according to the first embodiment of the present invention.

Next, on the resin layer 21 and the lenses 22 in the lens unit 20, the sealing resin 30 which is a second resin layer including adhesive is injected, and the lens unit 20 is flipped upside down such that the surface of the resin layer 21 on a side in which the concaves 21a are formed faces the sealing thin-film 19 of the organic EL unit 10, as illustrated in FIG. 7F (step 17). Subsequently, the sealing resin 30 and the organic EL unit 10 are bonded, thereby bonding the lens unit 20 and the organic EL unit 10 by the sealing resin 30. Note that, photo-curable resin is used as the sealing resin 30 in this embodiment.

With the processes described above, the display panel apparatus 1 according to the first embodiment of the present invention is formed as illustrated in FIG. 7.

Second Embodiment

Figure 8:
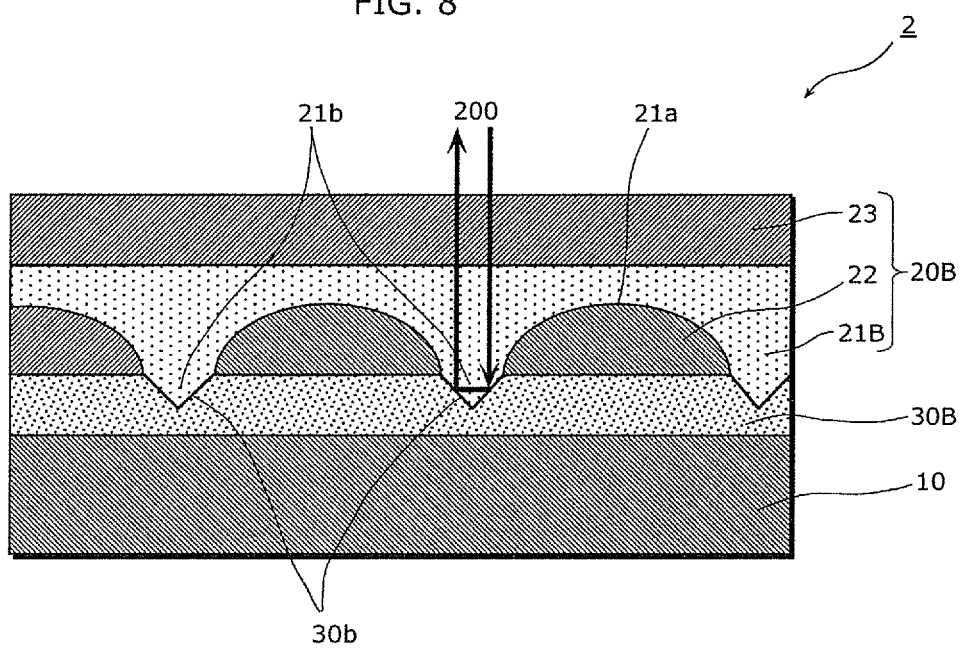
FIG. 8 is a partial enlarged cross-section view of a display panel apparatus according to the second embodiment of the present invention.

Next, the display panel apparatus 2 according to the second embodiment shall be described with reference to FIG. 8. FIG. 8 is a partial enlarged cross-section view of a display panel apparatus 2 according to the second embodiment of the present invention. Note that, in FIG. 8, the same reference numerals are assigned to the components identical to those in the display panel apparatus 1 according to the first embodiment of the present invention in FIG. 2, and the description for these components are omitted.

The display panel apparatus 2 according to the second embodiment of the present invention differs from the display panel apparatus 1 according to the first embodiment of the present invention in the structure of the resin layer and the sealing resin.

In the display panel apparatus 2 according to the second embodiment of the present invention, the resin layer 21B of the lens unit 20B includes protrusions 21b protruding toward the organic EL unit 10. The protrusions 21b is formed to protrude from a reference plane of the resin layer in which the concaves 21a are formed. The protrusions 21b form recesses 30b in the sealing resin 30B when bonding the organic EL unit 10 and the lens unit 20B.

Furthermore, in this embodiment, the protrusion 21b of the resin layer 21B is triangular in cross-section, and the angle of its top is 90 degrees. Thus, the basic angle of the recess 30b formed in the sealing resin 30B is 90 degrees.

As described above, in the display panel apparatus 2 according to this embodiment, the recesses 30b are formed in the sealing resin 30B by the protrusions 21b of the resin layer 21B. This structure allows the recesses 30b to completely reflect the light 200 which enters the glass layer 23 with an angle perpendicular to the main surface of the glass layer 23 from outside of the display panel apparatus 2. Thus, it is possible to improve the visibility of alignment marks formed on the organic EL unit 10, so that the organic EL unit 10 and the lens unit 20B are bonded at high precision. Note that, the alignment marks are formed on the transparent electrode of the organic EL unit 10, i.e., the first electrode 14.

Note that, according to the display panel apparatus 2 according to this embodiment, in addition to the effects achieved by the display panel apparatus 1 according to the first embodiment, the display panel apparatus can be manufactured at high precision.

Next, the manufacturing method of the display panel apparatus 2 according to the second embodiment shall be described using FIGS. 9A to 9F and with reference to FIGS. 3 and 8. FIGS. 9A to 9F are cross-sectional views of the components of the display panel apparatus 2 in each process of the manufacturing method of the display panel apparatus 2 according to the second embodiment.

First, in the same manner as the first embodiment, the organic EL unit 10 including an array of the red pixel unit 12R having the red organic luminescent layer 11R, the green pixel unit 12G having the green organic luminescent layer 11G, and the blue pixel unit 12B having the blue organic luminescent layer 11B are formed on the substrate 13 on which a planarizing film is formed (step 21).

Figure 9A:
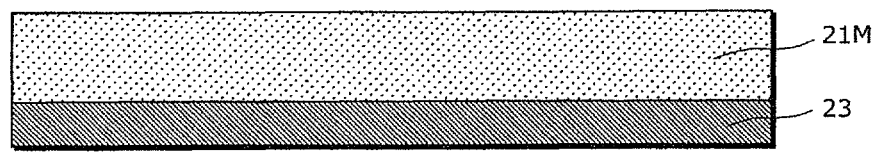
FIG. 9A is a cross-section of the components composing the display panel apparatus in step 22 of the manufacturing method of the display panel apparatus according to the second embodiment.

Next, as illustrated in FIG. 9A, in the same manner as FIG. 7A, a resin film 21M is formed by painting predetermined resin material on the surface of the glass layer 23 which is a glass substrate of BK7 (step 22). The resin made of acrylate monomer and fluoropolymer with a refractive index of 1.4 is used for a resin film 21M in this embodiment as well.

Figure 9B:
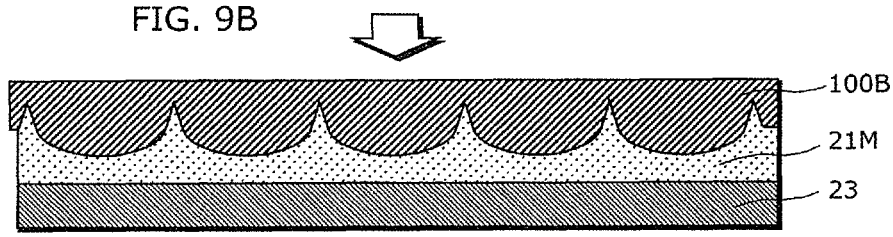
FIG. 9B is a cross-section of the components of the display panel apparatus in step 23 of the manufacturing method of the display panel apparatus according to the second embodiment of the present invention.
Figure 9C:
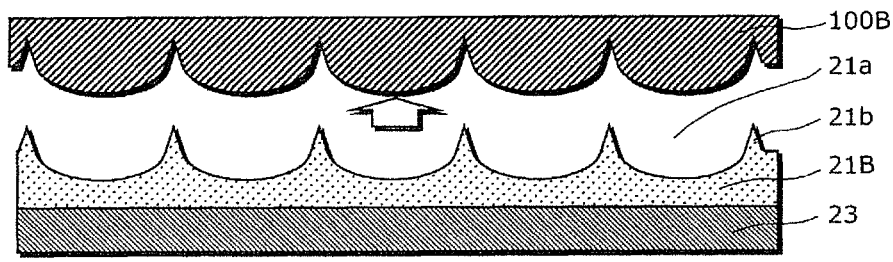
FIG. 9C is a cross-section of the components of the display panel apparatus in step 24 of the manufacturing method of the display panel apparatus according to the second embodiment of the present invention.
Figure 9D:
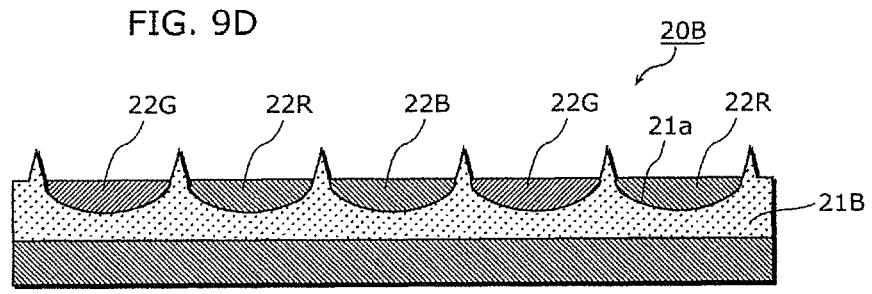
FIG. 9D is a cross-section of the components of the display panel apparatus in step 25 of the manufacturing method of the display panel apparatus according to the second embodiment of the present invention.

Next, as illustrated in FIG. 9B, the metallic mold 100B with convexes is pressed into the resin film 21M (step 23). In this embodiment, the gaps between convexes of the metallic mold 100B have triangular V-shaped trenches. Subsequently, as illustrated in FIG. 9C, the metallic mold 100B is removed from the resin film 21M after curing the resin film 21M (step 24). With the process described above, the resin layer 21B including concaves 21a and protrusions 21b is formed.

The concaves 21a in the resin layer 21B is formed corresponding to the convexes of the metallic mold 100B and recessed toward the glass layer 23. The concaves 21a are formed to correspond to the red pixel units 12R, the green pixel units 12G, and the blue pixel units 12B. The protrusions 21b of the resin layer 21B are formed between concaves 21a.

Next, the predetermined lens resin material 22M is filled into the concaves 21a. Here, the lens resin material 22M as much as necessary for forming the lens for red 22R is filled into the concaves 21a corresponding to the red pixel units 12R. The lens resin material 22M for the lens for green 22G and for the lens for blue 22B is filled into the concaves 21a corresponding to the green pixel units 12G and the blue pixel units 12B. Subsequently, the lens resin material 22M is cured. With the process described above, the lens unit 20B illustrated in FIG. 9D is formed (step 25). In this embodiment, in the same manner as the first embodiment, the epoxy resin with the refractive index of 1.5 is used for the lens resin material 22M for the lens for red 22R. The resin made of multifunctional acrylate and inorganic particulates and with the refractive index of 1.9 is used for the lens resin material 22M for the lens for green 22G and the lens for blue 22B.

Figure 9E:
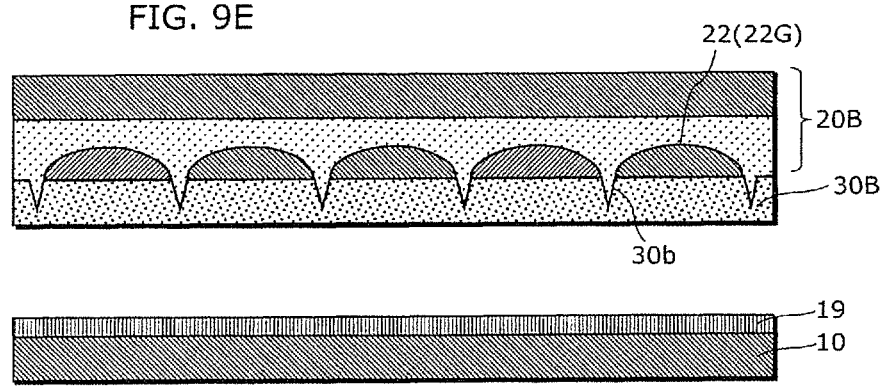
FIG. 9E is a cross-section of the components of the display panel apparatus in step 26 of the manufacturing method of the display panel apparatus according to the second embodiment of the present invention.

Next, on the resin layer 21 and the lenses 22 in the lens unit 20B, the sealing resin 30 which is a second resin layer including adhesive is injected, and the lens unit 20 is flipped upside down as illustrated in FIG. 9E such that the surface of the resin layer 21 on a side in which the concaves 21a are formed faces the sealing thin-film 19 of the organic EL unit 10 (step 26). Here, the recesses 30b are formed by the protrusions 21b of the resin layer 21B. Subsequently, the lens unit 20B and the organic EL unit 10 are bonded by bonding the sealing resin 30B and the organic EL unit 10 and curing the sealing resin. Note that, photo-curable resin is used as the sealing resin 30.

Figure 9F:
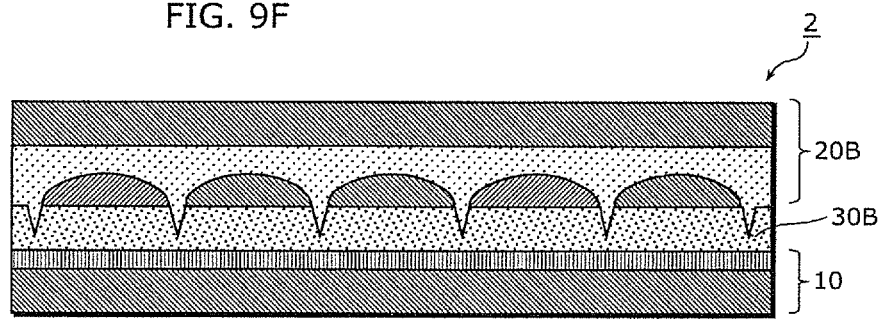
FIG. 9F is a cross-section of the display panel apparatus manufactured by the manufacturing method of the display panel apparatus according to the second embodiment of the present invention.

With the processes described above, the display panel apparatus 2 according to the second embodiment of the present invention is formed as illustrated in FIG. 9F.

Third Embodiment

Figure 10:
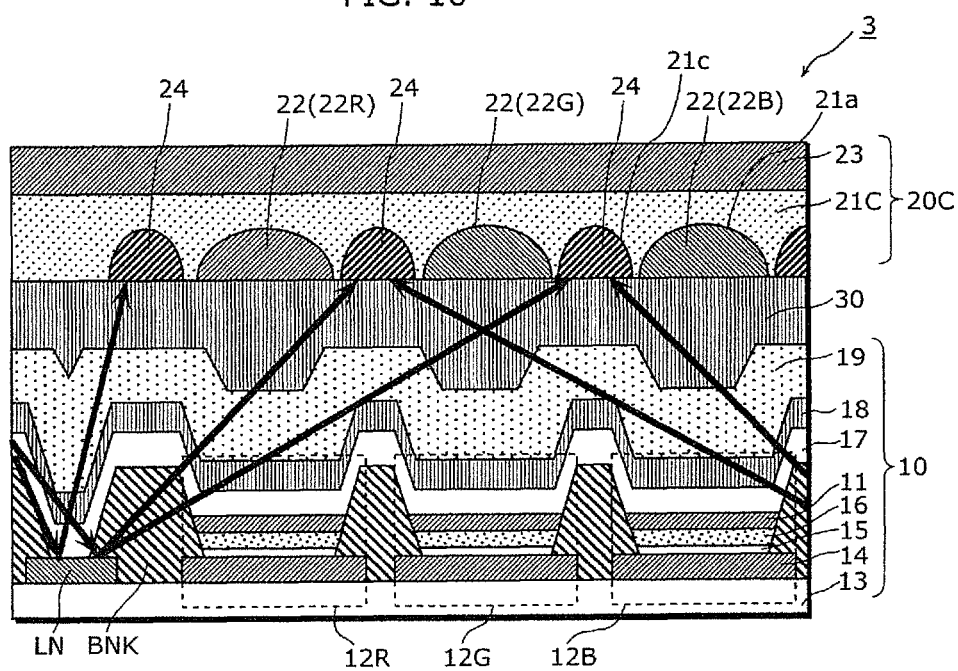
FIG. 10 is a cross-section of a display panel apparatus according to the third embodiment of the present invention.

Next, the display panel apparatus 3 according to the third embodiment shall be described with reference to FIG. 10. FIG. 10 is a cross-section of a display panel apparatus 3 according to the third embodiment of the present invention. Note that, in FIG. 10, the same reference numerals are assigned to the components identical to those in the display panel apparatus 1 according to the first embodiment of the present invention in FIG. 3, and the description for these components are omitted.

In the display panel apparatus 3 according to the third embodiment of the present invention, the resin layer 21C of the lens unit 20C includes second concaves 21c recessed toward the glass layer 23. The second concaves 21c are formed between the concaves 21a.

The second concaves 21c are filled with the partitions 24 up to a substantially same level as the surface of the resin layer on the organic EL unit 10. Light absorbing material such as black carbon black can be used for the partitions 24.

As such, the partitions 24 buried between the adjacent lenses 22 are formed on the resin layer 21C. More specifically, black partitions 24 are formed between the lenses, i.e., the lenses for red 22R, the lenses for green 22G, and the lenses for blue 22B.

As described above, in the display panel apparatus 3 according to the third embodiment of the present invention, the partitions 24 are formed between the lenses 22. Thus, the light reflected on the line LN such as the bus lines formed in the organic EL unit 10 can be absorbed by the partitions 24, as illustrated in FIG. 10. Therefore, the amount of light reflected on the lines LN and exits to outside of the display panel apparatus 3 can be reduced. Thus, it is possible to suppress the discoloration of the display panel apparatus due to the reflected light.

Furthermore, the partitions 24 can also absorb the light emitted from the organic luminescent layer 11 and completely reflected on the glass layer 23. With this, it is possible to prevent the reflected light from entering the adjacent luminescent region. The partitions 24 can also absorb the stray light which is the light emitted from the organic luminescent layer 11 and directly traveling to the pixel units 12 in different colors. The partitions 24 can also absorb outside light entering from outside of the display panel apparatus 3. As such, the contrast of the display panel apparatus 3 can be improved.

Figure 11:
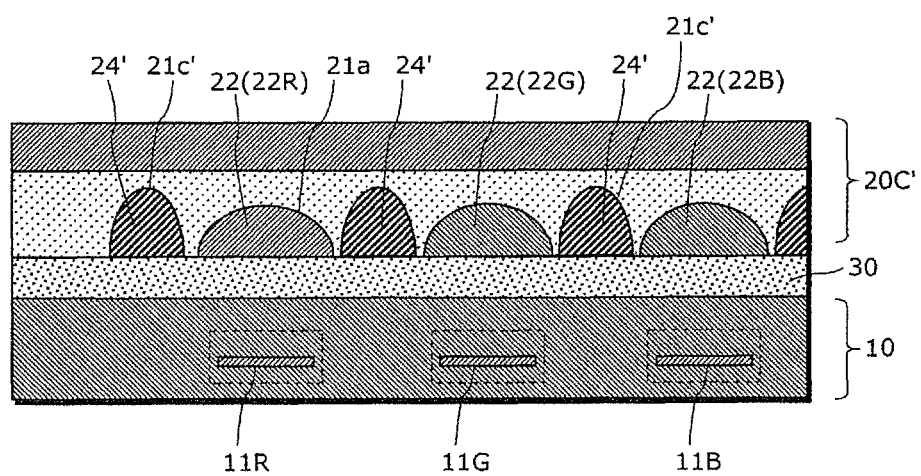
FIG. 11 is a partial enlarged cross-section view of a display panel apparatus according to Variation of the third embodiment of the present invention.

Note that, although the depth of the concaves 21a and the depth of the second concaves 21c are approximately same, and the height of the lenses 22 and the height of the partitions 24 are approximately same as well in this embodiment, it is not limited to this example. For example, as illustrated in FIG. 11, the depth of the second concaves 21c' corresponding to the partitions 24' may be deeper than the depth of the concaves 21a corresponding to the lenses 22. Note that, in FIG. 11, the same reference numerals are assigned to components identical to those in FIG. 10.

As described above, making the depth of the second concaves 21c' deeper than the depth of the concaves 21a allows the height of the partitions 24' in the resin layer 21C' higher than the height of the lenses 22, as illustrated in FIG. 11. This increases the region for absorbing the light reflected on the line LN of the organic EL unit 10 as much as the increase in the height of the partitions 24'. Thus, the amount of light reflected on the line LN and exits to outside of the display panel apparatus can further be reduced. Therefore, the contrast of the image can further be improved.

As described above, the display panel apparatus 3 of this embodiment can achieve the effect of improving the contrast of the image by reducing the light reflected on the lines LN, in addition to the effect of the display panel apparatus 1 according to the first embodiment of the present invention.

Next, the manufacturing method of the display panel apparatus 3 according to the third embodiment shall be described using FIGS. 12A to 12G and with reference to FIGS. 3 and 11. FIGS. 12A to 12G are cross-sectional views of the components of the display panel apparatus 3 in each process of the manufacturing method of the display panel apparatus 3 according to the third embodiment of the present invention.

First, in the same manner as the first and second embodiments, the organic EL unit 10 including an array of the red pixel unit 12R having the red organic luminescent layer 11R, the green pixel unit 12G having the green organic luminescent layer 11G, and the blue pixel unit 12B having the blue organic luminescent layer 11B are formed on the substrate 13 on which a planarizing film is formed (step 31).

Figure 12A:
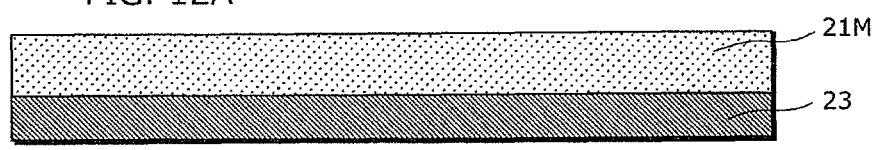
FIG. 12A is a cross-section of the components composing the display panel apparatus in step 32 of the manufacturing method of the display panel apparatus according to the third embodiment.

Next, as illustrated in FIG. 12A, a resin film 21M is formed by painting predetermined resin material on the surface of the glass layer 23 which is a glass substrate of BK7 (step 32). The same material as in the first embodiment is used for the resin film 21M.

Figure 12B:
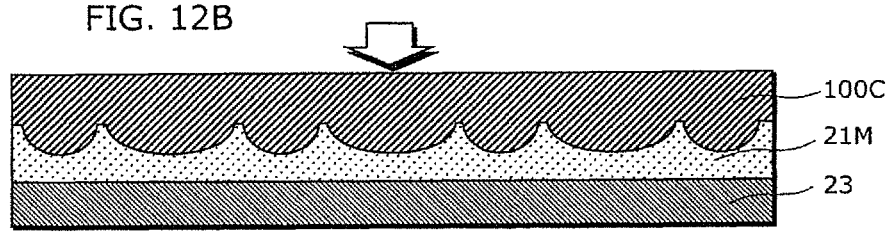
FIG. 12B is a cross-section of the components of the display panel apparatus in step 33 of the manufacturing method of the display panel apparatus according to the third embodiment of the present invention.
Figure 12C:
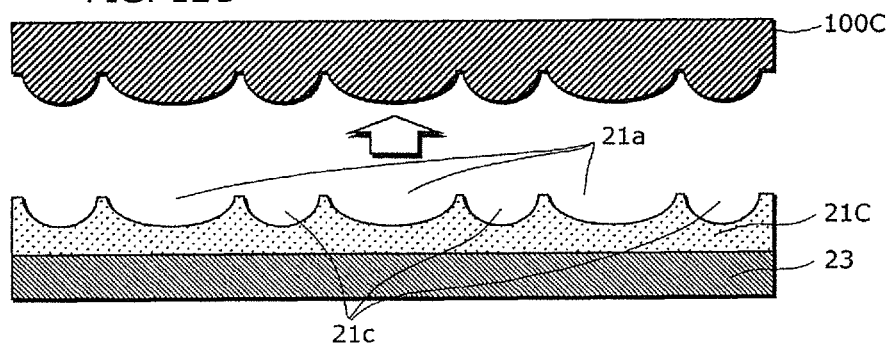
FIG. 12C is a cross-section of the components of the display panel apparatus in step 34 of the manufacturing method of the display panel apparatus according to the third embodiment of the present invention.

Next, as illustrated in FIG. 12B, the metallic mold 100 with two different convexes in different size is pressed into the resin film 21M (step 33). Subsequently, as illustrated in FIG. 12C, the metallic mold 100 is removed from the resin film 21M after curing the resin film 21M (step 34). With the process described above, the resin layer 21C including the concaves 21a and the second concaves 21c is formed.

The concaves 21a and the second concaves 21c in the resin layer 21C is formed corresponding to the convexes of the metallic mold 100C and recessed toward the glass layer 23. The concaves 21a are formed to correspond to the red pixel units 12R, the green pixel units 12G, and the blue pixel units 12B. The second concaves 21c are formed to correspond to the partitions 24.

Figure 12D:
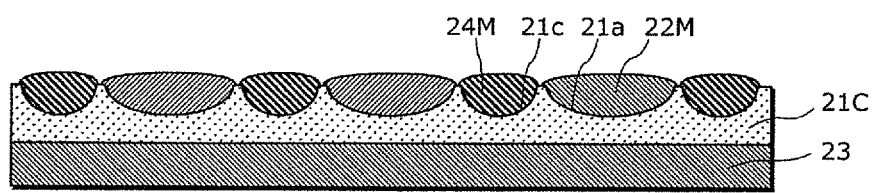
FIG. 12D is a cross-section of the components of the display panel apparatus in step 35 of the manufacturing method of the display panel apparatus according to the third embodiment of the present invention.

Next, as illustrated in FIG. 12D, a predetermined lens resin material 22M is filled into the concaves 21a (step 35). The second concaves 21c are filled by dropping the predetermined partitions resin material 24M. The same material as in the first embodiment is used for the lens resin material 22M. In addition, carbon black is used for the partition resin material 24M, and dissolved carbon black is painted on the second concaves 21c by dropping.

Note that, when filling the concaves 21a with the lens resin material 22M, the lens resin material 22M is filled overflowing the surface of the resin layer 21C, as illustrated in FIG. 12D. Subsequently, the lens resin material 22M is cured.

Figure 12E:
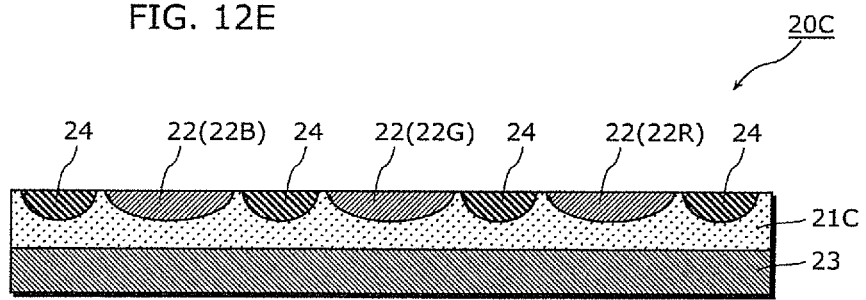
FIG. 12E is a cross-section of the components of the display panel apparatus in step 36 of the manufacturing method of the display panel apparatus according to the third embodiment of the present invention.

Next, the surface of the resin layer 21C on which the lens resin material 22M is filled is planarized by scraping the lens resin material 22M overflowing the resin layer 21C and at a level above the surface of the resin layer 21C, as illustrated in FIG. 12E (step 36). With this, the surface of the lens resin material 22M and the surface of the resin layer 21C are at a substantially same level as the surface of the resin layer 21. As such, the lenses for red 22R, the lenses for green 22G, the lenses for blue 22B, and the partitions 24 buried in the resin layer 21C are formed. With the processes described above, the lens unit 20C is formed.

Figure 12F:
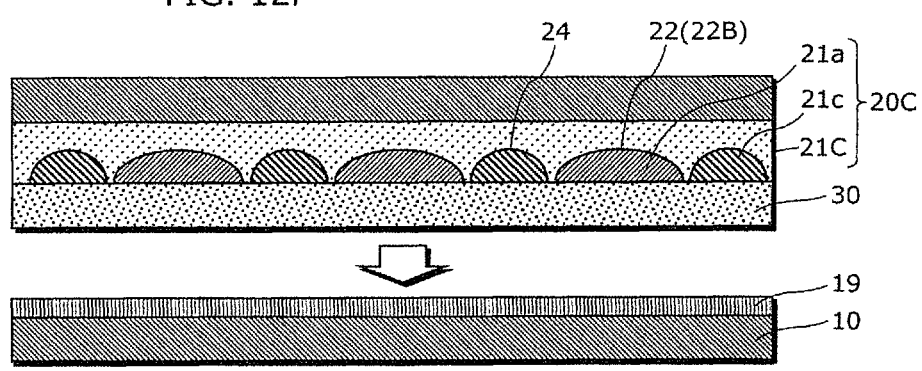
FIG. 12F is a cross-section of the components of the display panel apparatus in step 37 of the manufacturing method of the display panel apparatus according to the third embodiment of the present invention.

Next, on the resin layer 21C and the lenses 22 in the lens unit 20C, the sealing resin 30 which is a second resin layer including adhesive is injected, and the lens unit 20C is flipped upside down such that the surface of the resin layer 21 on a side in which the concaves 21a are formed faces the sealing thin-film 19 of the organic EL unit 10, as illustrated in FIG. 12F (step 37). Subsequently, the sealing resin 30 and the organic EL unit 10 are bonded, thereby bonding the lens unit 20 and the organic EL unit 10 by curing the sealing resin 30. Note that, photo-curable resin is used as the sealing resin 30 in this embodiment as well.

Figure 12G:
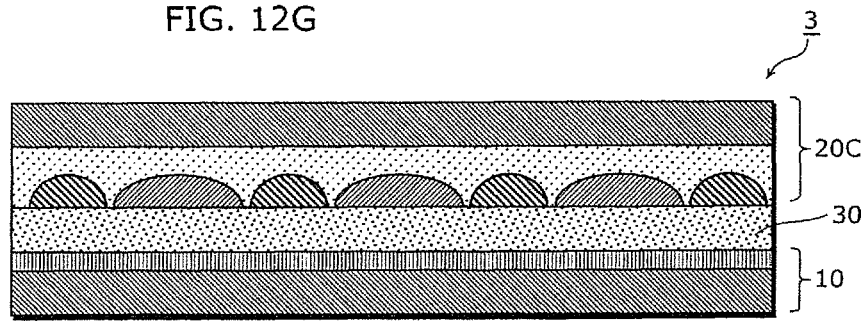
FIG. 12G is a cross-section of the display panel apparatus manufactured by the manufacturing method of the display panel apparatus according to the third embodiment of the present invention.

With the processes described above, the display panel apparatus 3 according to the third embodiment of the present invention is formed as illustrated in FIG. 12G. Note that, the height of the convexes of the metallic mold 100C may be adjusted for adjusting the depths of the concaves 21a and the second concaves 21c to be different.

Figure 13:
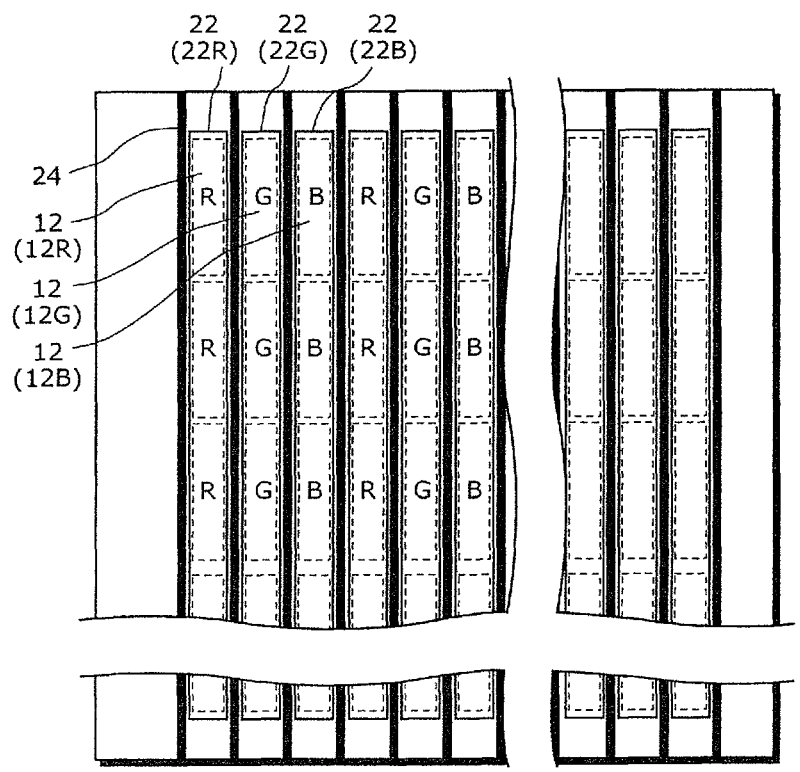
FIG. 13 is a planar view of a display panel apparatus according to the third embodiment of the present invention.
Figure 14:
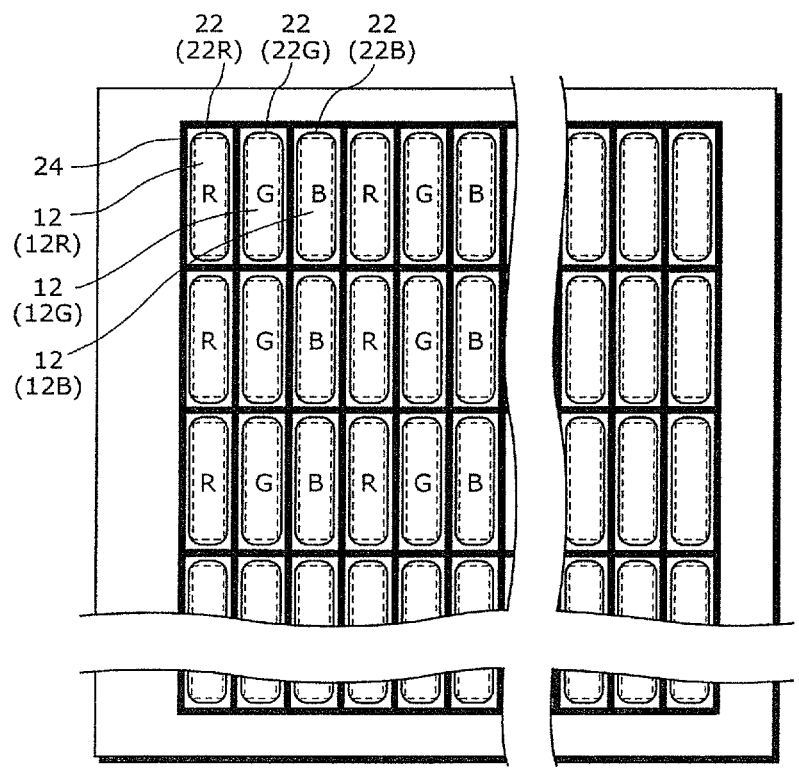
FIG. 14 is a planar view of a display panel apparatus according to Variation of the third embodiment of the present invention.

As described above, the display panel apparatus 3 according to this embodiment includes the partitions 24 between the lenses 22 in different color. However, the partitions 24 may be arranged in stripe only in the column direction, as illustrated in FIG. 13. In this case, the lenses 22 may be a lenticular lens common to the pixel units in the same color arranged between the partitions 24 and in the column direction. Note that, even when the partitions 24 are arranged as illustrated in FIG. 13, the lenses 22 may be provided for each pixel unit 12.

In addition, as another structure of the partitions 24, the partitions 24 may be arranged in grid for partitioning the pixel units 12 not only the pixel unit 12 in different colors but also the pixel units 12 in the same color. In this case, the lenses 22 are arranged to correspond to the pixel units 12.

Fourth Embodiment

Figure 15:
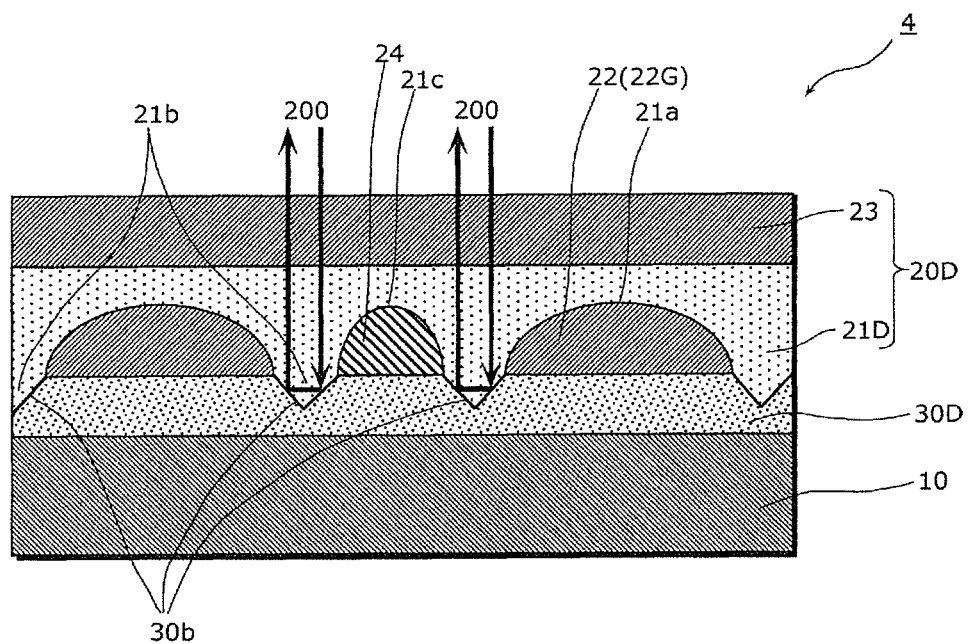
FIG. 15 is a partial enlarged cross-section view of a display panel apparatus according to the fourth embodiment of the present invention.

Next, the display panel apparatus 4 according to the fourth embodiment of the present invention shall be described with reference to FIG. 15. FIG. 15 is a partial enlarged cross-section of a display panel apparatus 4 according to the fourth embodiment of the present invention. Note that, in FIG. 15, the same reference numerals are assigned to the components identical to those in the display panel apparatus 1 according to the first embodiment of the present invention in FIG. 3, and the description for these components are omitted.

In the same manner as the second embodiment, the display panel apparatus 4 according to the fourth embodiment of the present invention includes a resin layer 21D of a lens unit 20D having protrusions 21b protruding toward the organic EL unit 10.

This structure allows the recesses 30b to completely reflect the light 200 which enters the glass layer 23 perpendicular to the main surface of the glass layer 23 from outside of the display panel apparatus 4. Thus, it is possible to improve the visibility of alignment marks formed on the organic EL unit 10, so that the organic EL unit 10 and the lens unit 20B are bonded at high precision.

In the display panel apparatus 4 according to this embodiment, the resin layer 21D includes the second concaves 21c recessed toward the glass layer 23, in the same manner as the third embodiment. The second concaves 21c is filled with the partitions 24 up to a substantially same level as the surface of the resin layer 21D on the organic EL unit 10.

This structure allows the partitions 24 to absorb the light reflected on the lines LN formed in the organic EL unit 10. Therefore, the amount of light reflected on the lines LN and exits to outside of the display panel apparatus 4 can be reduced. Thus, it is possible to suppress the discoloration of the display panel apparatus due to the reflected light.

Furthermore, the protrusions 21b in the display panel apparatus 4 according to the fourth embodiment of the present invention prevents the lens resin material to be filled into the concaves 21a and the partition resin material to be filled into the second concaves 21c from being mixed as well.

As described above, according to the display panel apparatus 4 of this embodiment, in addition to the effects achieved by the display panel apparatuses 1 to 3 according to the first to third embodiments, it is possible to prevent the lens resin material and the partition resin material from being mixed in the manufacturing process. This allows manufacturing the display panel apparatus with high light-extraction efficiency and high contrast.

Note that, the display panel apparatus 4 according to the fourth embodiment can be manufactured by using the metallic mold 100B used in the manufacturing method of the display panel apparatus 2 according to the second embodiment of the present invention in the manufacturing method of the display panel apparatus 3 according to the third embodiment of the present invention.

Fifth Embodiment

Figure 16:
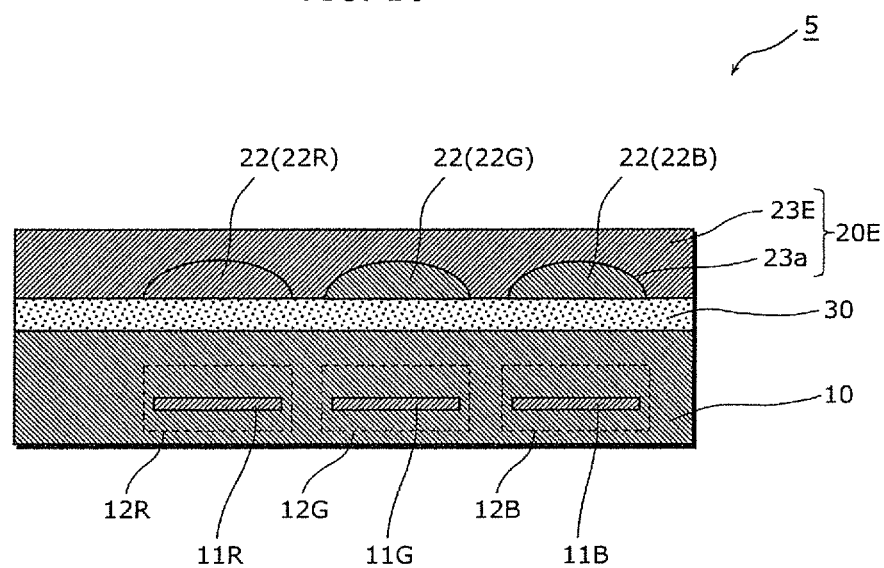
FIG. 16 is a cross-section of a display panel apparatus according to the fifth embodiment of the present invention.

Next, the display panel apparatus 5 according to the fifth embodiment of the present invention shall be described with reference to FIG. 16. FIG. 16 is a cross-section of a display panel apparatus 5 according to the fifth embodiment of the present invention. Note that, in FIG. 16, the same reference numerals are assigned to the components identical to those in the display panel apparatus 1 according to the first embodiment of the present invention in FIG. 2, the description for these components are omitted or simplified.

As illustrated in FIG. 16, in the display panel apparatus 5 according to this embodiment, the lens unit is not provided with a resin layer as in the other embodiments described above, and the lens unit 20E according to this embodiment is composed of the lenses 22 and the glass layer 23E (glass substrate).

The glass layer 23E constitutes the external surface of the display panel apparatus 5. For example, BK7 is used for the glass layer 23E, and its refractive index $n_g$ is $n_g=1.5$.

Concaves 23a recessed toward the external surface of the glass layer 23E are formed in the surface of the glass layer 23E on a side toward the organic EL unit 10. Each of the concaves 23a corresponds to one of the red pixel unit 12R, the green pixel unit 12G, and the blue pixel unit 12B.

The lenses 22 are formed by filling a predetermined lens resin into the concaves 23a of the resin layer 23E. The lenses 22 are filled up to a substantially same level as the surface of the glass layer 23E on the organic EL 10. Note that, in the same manner as the first embodiment, the lenses 22 includes the lens for red 22R corresponding to the red pixel unit 12R, the lens for green 22G corresponding to the green pixel unit 12G, and the lens for blue 22B corresponding to the blue pixel unit 12B.

In the display panel apparatus 5 according to the fifth embodiment, the refractive index $nH_B$ of the lens for blue 22B is set to be higher than the refractive index $nH_R$ of the lens for red 22R, in the same manner as the first embodiment. The refractive index $nH_G$ of the lens for green 22G is also set to be higher than the refractive index $nH_R$ of the lens for red 22R.

In this embodiment, the lens for red 22R is made of epoxy resin, and its refractive index $nH_R$ is $nH_R=1.5$ as well. The lens for green 22G and the lens for blue 22B are made of multifunctional acrylate and inorganic particulate, and the refractive indices $nH_G$ and $nH_B$ are $nH_B=nH_G=1.9$.

As described above, in the display panel apparatus 5 according to the fifth embodiment, the refractive index $nH_B$ of the lens for blue 22B is set to be higher than the refractive index $nH_R$ of the lens for red 22R. As a result, it is possible to make the light-extraction efficiency of the blue pixel unit 12B closer to the light-extraction efficiency of the red pixel unit 12R. Thus, it is possible to reduce the consumption power of the blue pixel unit 12B. In addition, it is possible to reduce the voltage applied to the blue pixel unit 12B, thereby preventing the life of the blue organic luminescent layer 11B from shortening. Therefore, it is possible to suppress the variation of life between the blue pixel unit 12B and the red pixel unit 12R or the green pixel unit 12G. In addition, similar effect can be achieved for the lens for green 22G in the same manner as the first embodiment.

In addition, in the display panel apparatus 5 according to this embodiment, the lenses are formed by filling the lens resin into the concaves 23a formed on the glass layer 23E. With this, it is possible to independently form the lenses 22 corresponding to the red pixel unit 12R, the green pixel unit 12G, and the blue pixel unit 12B, in the same manner as the first embodiment. Therefore, it is possible to form the lenses 22 for each color selecting the lens resin with refractive indices most suitable for each pixel unit, thereby optimizing the light-extraction efficiency from the pixel unit 12 in each color.

In addition, in the display panel apparatus 5 according to this embodiment, the concaves 23a are filled with the lens resin up to a substantially same level as the surface of the organic EL unit 10 of the glass layer, in the same manner as the first embodiment. With this, the concaves 23a are filled with the lens resin without any space, preventing the decrease in the light-extraction efficiency.

Thus, in this embodiment, it is not necessary to use the lens sheet having the base as the base material as in the conventional technology, thereby allowing the layer between the glass layer 23E and the pixel unit 12 to be thin, in the same manner as the first embodiment. Therefore, the light-extraction efficiency can further be improved.

In the display panel apparatus 5 according to this embodiment, the resin layer 21 as in the first embodiment is not provided, and the lenses 22 are formed directly on the glass layer 23E. With this structure, it is not necessary to provide the resin layer for bonding the lenses and the glass layer as in the conventional technology, thereby making the entire display panel apparatus to be thinner and reducing the manufacturing cost. Furthermore, the light-extraction efficiency can be improved since the resin layer 21 is not formed.

Next, the manufacturing method of the display panel apparatus 5 according to the fifth embodiment shall be described using FIGS. 17A to 17E and with reference to FIGS. 3 and 16. FIGS. 17A to 17E are cross-sectional views of the components of the display panel apparatus 5 in each process of the manufacturing method of the display panel apparatus 5 according to the fifth embodiment of the present invention.

First, the organic EL unit 10 including an array of the red pixel unit 12R having the red organic luminescent layer 11R, the green pixel unit 12G having the green organic luminescent layer 11G, and the blue pixel unit 12B having the blue organic luminescent layer 11B are formed on the substrate 13 on which a planarizing film for planarizing the surface of the TFT layer is formed (step 51).

Figure 17A:
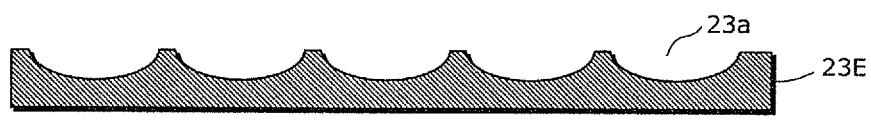
FIG. 17A is a cross-section of the components composing the display panel apparatus in step 52 of the manufacturing method of the display panel apparatus according to the fifth embodiment of the present invention.

Next, the concaves 23a are formed in the glass layer 23E which is the glass substrate, as illustrated in FIG. 17A (step 52). In this embodiment, BK7 with a refractive index of 1.5 is used as the glass substrate.

Figure 17B:
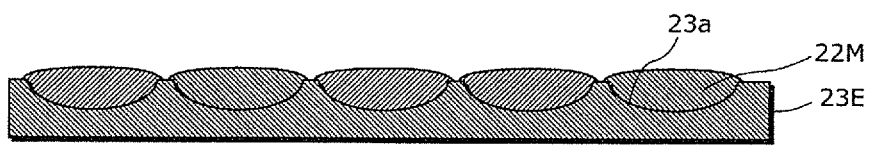
FIG. 17B is a cross-section of the components of the display panel apparatus in step 53 of the manufacturing method of the display panel apparatus according to the fifth embodiment of the present invention.

Next, the predetermined lens resin material 22M is filled into the concaves 23a, as illustrated in FIG. 17B (step 53). Here, the lens resin material 22M for the lens for red 22R is filled into the concaves 23a corresponding to the red pixel units 22R. The lens resin material 22M for the lens for green 22G and for the lens for blue 22B is filled into the concaves 23a corresponding to the green pixel units 12G and the blue pixel units 12B. In this embodiment, as described above, the epoxy resin with the refractive index of 1.5 is used for the lens resin material 22M for the lens for red 22R. The resin made of multifunctional acrylate and inorganic particulates and with the refractive index of 1.9 is used for the lens resin material 22M for the lens for green 22G and the lens for blue 22B.

Note that, when filling the lens resin material 22M into the concaves 23a, the lens resin material 22M is filled overflowing the surface of the resin layer 23E, as illustrated in FIG. 17B. Subsequently, the lens resin material 22M is cured.

Figure 17C:
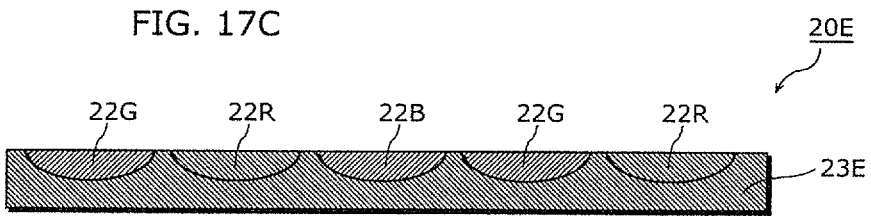
FIG. 17C is a cross-section of the components of the display panel apparatus in step 54 of the manufacturing method of the display panel apparatus according to the fifth embodiment of the present invention.

Next, the surface of the resin layer 23E on which the lens resin material 22M is filled is planarized by scraping the lens resin material 22M overflowing the glass layer 23E and at a level above the surface of the glass layer 23E, as illustrated in FIG. 17C (step 54). With this, the surface of the lens resin material 22M and the surface of the glass layer 23E are at a substantially same level as the surface of the glass layer 23E. As such, the lenses for red 22R, the lenses for green 22G, and the lenses for blue 22B buried in the resin layer 23 are formed. With the processes described above, the lens unit 20E is formed.

Figure 17D:
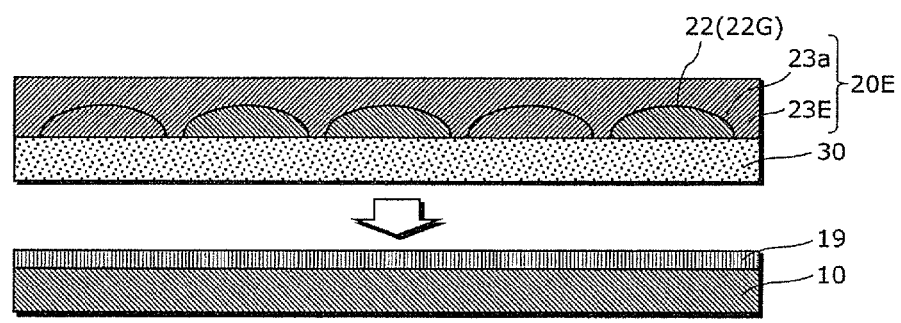
FIG. 17D is a cross-section of the components of the display panel apparatus in step 55 of the manufacturing method of the display panel apparatus according to the fifth embodiment of the present invention.

Next, on the glass layer 23E and the lenses 22 in the lens unit 20E, the sealing resin 30 which is a second resin layer including adhesive is injected, and the lens unit 20E is flipped upside down as illustrated in FIG. 17D such that the surface of the glass layer 23E on a side in which the concaves 23a are formed faces the sealing thin-film 19 of the organic EL unit 10 (step 55). Subsequently, the sealing resin 30 and the organic EL unit 10 are bonded, thereby bonding the lens unit 20E and the organic EL unit 10 by the sealing resin 30. Note that, photo-curable resin is used as the sealing resin 30 in this embodiment as well.

Figure 17E:
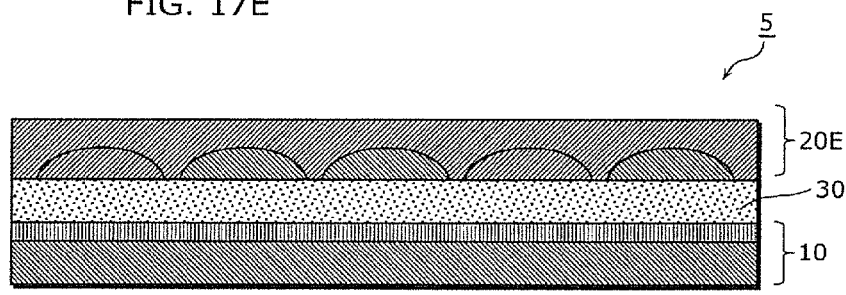
FIG. 17E is a cross-section of the display panel apparatus manufactured by the manufacturing method of the display panel apparatus according to the fifth embodiment of the present invention.

With the processes described above, the display panel apparatus 5 according to the fifth embodiment of the present invention is formed as illustrated in FIG. 17E.

As described above, in the display panel apparatus 5 according to this embodiment, the lenses 22 are formed on the glass layer 23E; that is, the concaves 23a for filling the lenses 22 are directly formed on the glass layer 23E as illustrated in FIG. 17A. A processing method using a micro ball end mill can be used for forming the concaves 23a on the glass layer 23E.

Figure 18:
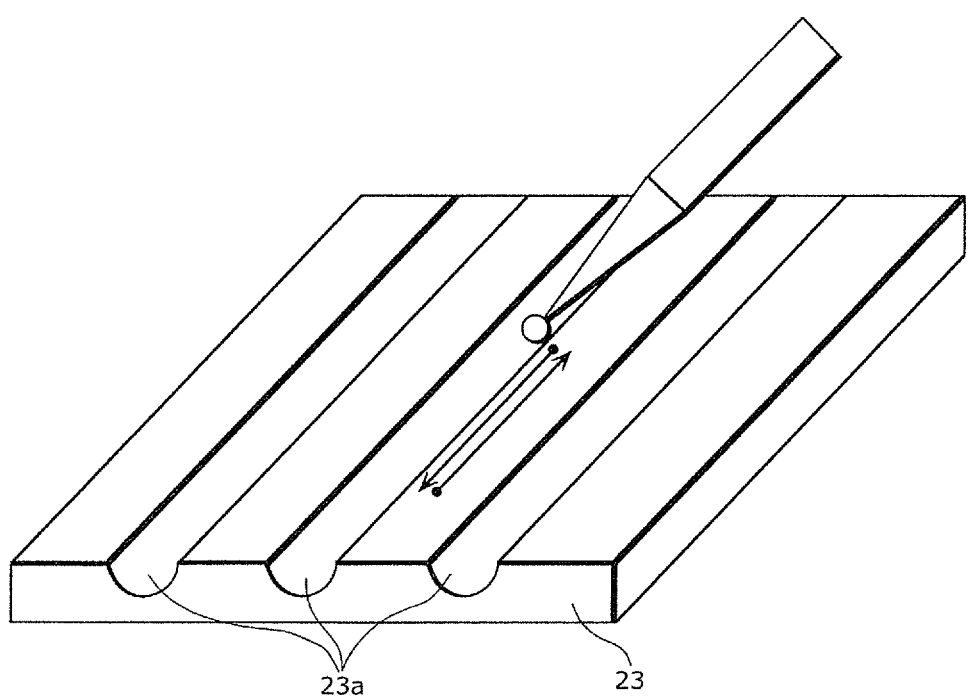
FIG. 18 illustrates a method for forming concaves corresponding to lenticular lenses arranged over the pixel units on the glass layer.
Figure 19:
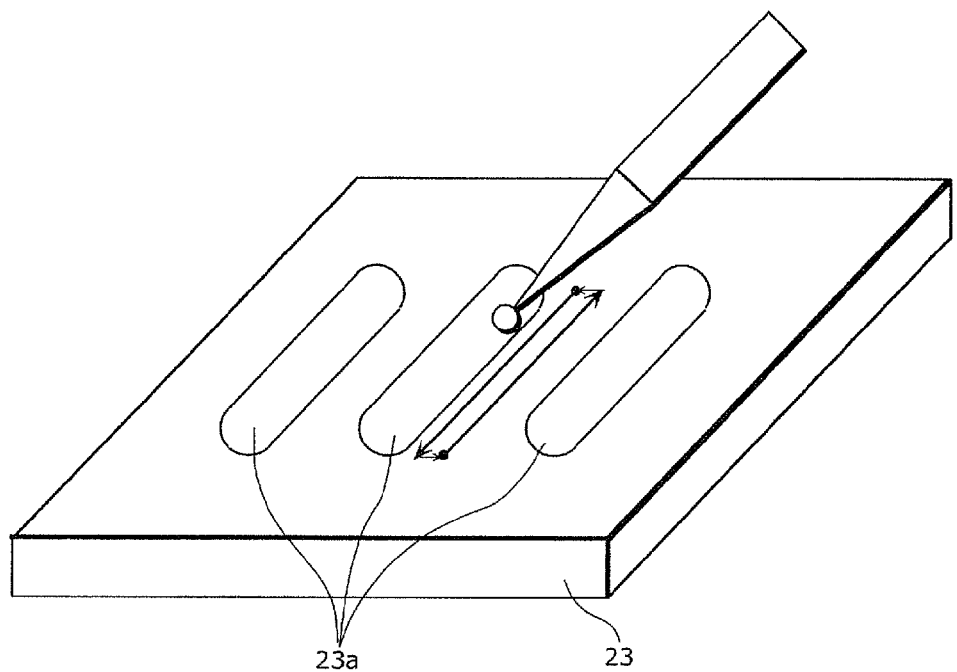
FIG. 19 illustrates a method for forming concaves corresponding to the lenses for the pixel units on the glass layer.

For example, when the lenses 22 are lenticular lenses provided over the pixel units 12 in the same color in the same column, multiple concaves 23a in stripe can be formed by an entire downcut by the micro ball end mill, as illustrated in FIG. 18. In addition, when arranging the lenses 22 for the pixel units 12, respectively, multiple concaves 23a each corresponding to one pixel may be formed by the entire downcut by the micro ball end mill, as illustrated in FIG. 19.

Sixth Embodiment

Figure 20:
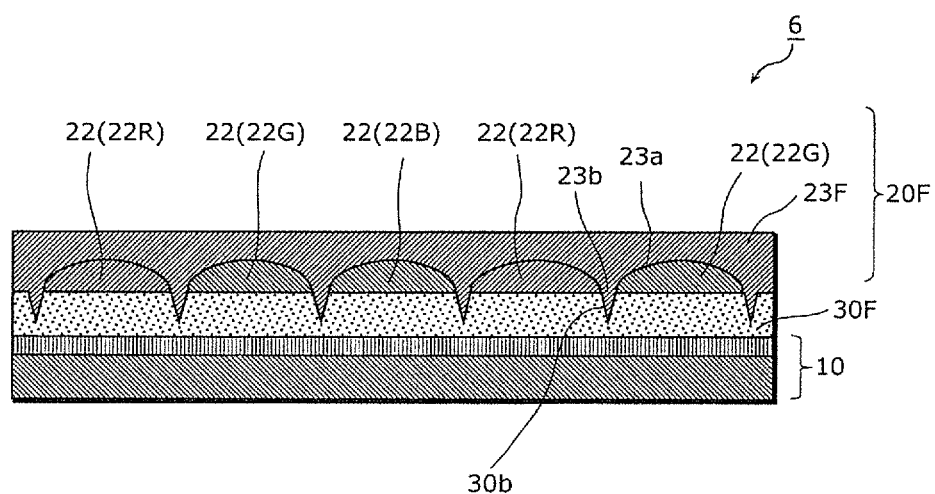
FIG. 20 is a cross-section of a display panel apparatus according to the sixth embodiment of the present invention.

Next, the display panel apparatus 6 according to the sixth embodiment of the present invention shall be described with reference to FIG. 20. FIG. 20 is a cross-section of a display panel apparatus 6 according to the sixth embodiment of the present invention. Note that, in FIG. 20, the same reference numerals are assigned to the components identical to those in the display panel apparatus 5 according to the fifth embodiment in FIG. 16, and the description for these components is omitted.

The display panel apparatus 6 according to the sixth embodiment of the present invention differs from the display panel apparatus 5 according to the fifth embodiment of the present invention in the structure of the glass layer.

In the display panel apparatus 6 according to the sixth embodiment of the present invention, the glass layer 23F in the lens unit 20F includes protrusions 23b protruding toward the organic EL unit 10. The protrusions 23b protrudes from a reference plane of the glass layer 23F in which the concaves 23a are formed. The protrusions 23b form recesses 30b of the sealing resin 30F when bonding the organic EL unit 10 and the lens unit 20F.

Furthermore, in this embodiment, the protrusion 23b of the glass layer 23F is triangular in cross-section, and the angle of its top is 90 degrees. Thus, the basic angle of the recess 30b formed on the sealing resin 30F is 90 degrees.

As described above, in the display panel apparatus 6 according to this embodiment, the recesses 30b are formed on the sealing resin 30F by the protrusions 23b of the glass layer 23F. This structure allows the recesses 30b to completely reflect the light 200 which enters the glass layer 23F and is perpendicular to the main surface of the glass layer 23 from outside of the display panel apparatus 2 in the same manner as the display panel apparatus according to the second embodiment illustrated in FIG. 8. Thus, it is possible to improve the visibility of the alignment marks formed on the organic EL unit 10, so that the organic EL unit 10 and the lens unit 20F are bonded at high precision.

Note that, according to the display panel apparatus 6 according to this embodiment, in addition to the effects achieved by the display panel apparatus 5 according to the fifth embodiment, the display panel apparatus can be manufactured at high precision.

Note that, the display panel apparatus 6 according to the sixth embodiment of the present invention can be manufactured by forming the protrusions 23b at the same time as the concaves 23a are formed when forming the concaves 23a on the glass layer 23 illustrated in FIG. 17A in the manufacturing method of the display panel apparatus 5 according to the fifth embodiment.

Seventh Embodiment

Figure 21:
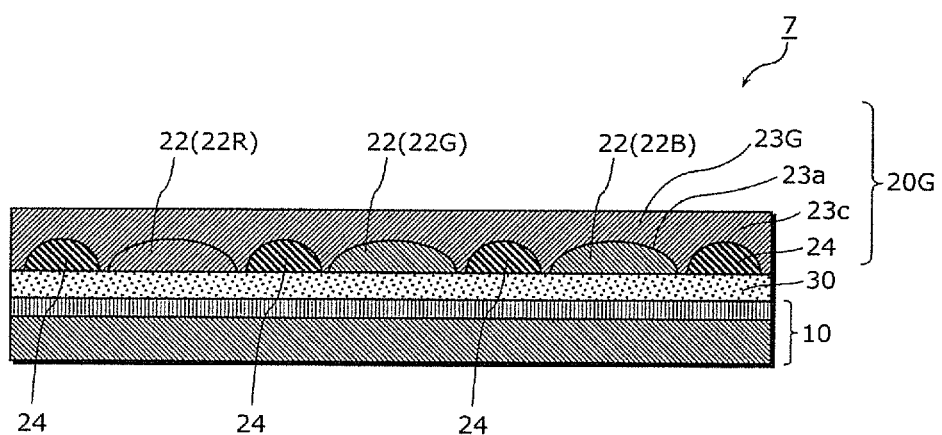
FIG. 21 is a cross-section of a display panel apparatus according to the seventh embodiment of the present invention.

Next, the display panel apparatus 7 according to the seventh embodiment of the present invention shall be described with reference to FIG. 21. FIG. 21 is a cross-section of a display panel apparatus 7 according to the seventh embodiment of the present invention. Note that, in FIG. 21, the same reference numerals are assigned to the components identical to those in the display panel apparatus 5 according to the fifth embodiment in FIG. 16, and the description for these components is omitted.

Note that, in the display panel apparatus 7 according to the seventh embodiment, the glass layer 23G includes second concaves 23c recessed toward the external surface of the glass layer 23G. The second concaves 23c are formed between the concaves 23a.

The second concaves 23c is filled with the partitions 24 up to a substantially same level as the surface of the glass layer 23G on the organic EL unit 10. Light absorbing material such as black carbon black can be used for the partitions 24.

As such, the partitions 24 buried between the adjacent lenses 22 are formed in the glass layer 23G. More specifically, black partitions 24 are formed between the lenses, i.e., the lenses for red 22R, the lenses for green 22G, and the lenses for blue 22B.

As described above, in the display panel apparatus 7 according to the seventh embodiment of the present invention, the partitions 24 are formed between the lenses 22. Thus, the light reflected on the line LN such as the bus lines formed in the organic EL unit 10 can be absorbed by the partitions 24, in the same manner as in FIG. 10. Therefore, the amount of light reflected on the lines LN and exits to outside of the display panel apparatus 7 can be reduced. Thus, it is possible to suppress the discoloration of the display panel apparatus due to the reflected light.

Furthermore, the partitions 24 can also absorb the light emitted from the organic luminescent layer and completely reflected on the glass layer 23G. With this, it is possible to prevent the reflected light from entering the adjacent luminescent region. The partitions 24 can also absorb the stray light which is the light emitted from the organic luminescent layer 11 and directly traveling to the pixel units 12 in different colors. The partitions 24 can also absorb outside light entering from outside of the display panel apparatus 7. As such, the contrast of the display panel apparatus 7 can be improved.

Note that, although the depth of the concaves 23a and the depth of the second concaves 23c are approximately same, and the height of the lenses 22 and the height of the partitions 24 are approximately same as well in this embodiment, it is not limited to this example. For example, as illustrated in the third embodiment and in FIG. 11, the depth of the second concaves 23c corresponding to the partitions 23c may be deeper than the depth of the second concaves 23c corresponding to the partitions. This structure allows decreasing the reflected light on the lines LN exiting to outside of the display panel apparatus further, thereby further improving the contrast.

As described above, the display panel apparatus 7 according to this embodiment can achieve the effect of improving the contrast of the image by reducing the light reflected on the lines LN, in addition to the effect of the display panel apparatus 5 according to the fifth embodiment of the present invention.

Note that, the display panel apparatus 7 according to the seventh embodiment of the present invention can be manufactured by forming the second concaves 23c at the same time as the concaves 23a are formed when forming the concaves 23a in the glass layer 23 illustrated in FIG. 17A in the manufacturing method of the display panel apparatus 5 according to the fifth embodiment, and by filling the partition resin material into the second concaves 23c.

Eighth Embodiment

Figure 22:
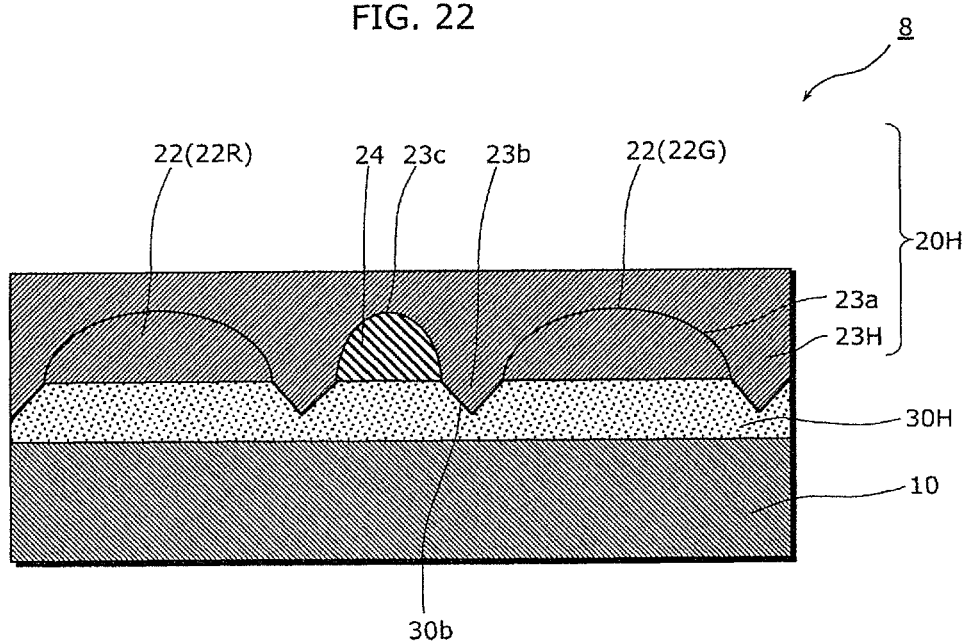
FIG. 22 is a partial enlarged cross-section view of a display panel apparatus according to the eighth embodiment of the present invention.

Next, the display panel apparatus 8 according to the eighth embodiment of the present invention shall be described with reference to FIG. 22. FIG. 22 is a partial enlarged cross-section of a display panel apparatus 8 according to the eighth embodiment of the present invention. Note that, in FIG. 22, the same reference numerals are assigned to the components identical to those in the display panel apparatus 5 according to the fifth embodiment in FIG. 16, and the description for these components is omitted.

In the same manner as the sixth embodiment, in the display panel apparatus 8 according to the eighth embodiment of the present invention, the glass layer 23H in the lens unit 20H includes protrusions 23b protruding toward the organic EL unit 10.

With this, recesses 30b are formed in the sealing resin 30H by the protrusions 23b. This structure allows the recesses 30b to completely reflect the light which enters the glass layer 23H and perpendicular to the main surface of the glass layer 23 from outside of the display panel apparatus 8. Thus, it is possible to improve the visibility of alignment marks formed on the organic EL unit 10, so that the organic EL unit 10 and the lens unit 20H are bonded at high precision.

In the display panel apparatus 8 according to this embodiment, in the same manner as the seventh embodiment, the glass layer 23H further includes second concaves 23c recessed toward an outer surface of the glass layer 23H. The second concaves 23c are filled with the partitions 24 up to a substantially same level as the surface of the glass layer 23H on a side toward the organic EL unit 10.

This structure allows the partitions 24 to absorb the light reflected on the lines LN formed in the organic EL unit 10. Therefore, the amount of light reflected on the lines LN and exits to outside of the display panel apparatus 8 can be reduced. Thus, it is possible to suppress the discoloration of the display panel apparatus due to the reflected light.

Furthermore, the protrusions 23b in the display panel apparatus 8 according to the eighth embodiment of the present invention prevents the lens resin material to be filled into the concaves 23a and the partition resin material to be filled into the second concaves 23c from being mixed.

Note that, the display panel apparatus 8 according to the eighth embodiment of the present invention can be manufactured by forming the protrusions 23b and the second concaves 23c at the same time as the concaves 23a are formed when forming the concaves 23a in the glass layer 23E illustrated in FIG. 17A in the manufacturing method of the display panel apparatus 5 according to the fifth embodiment, and filling the second concaves 23c with the partition resin material.

As described above, according to the display panel apparatus 8 of this embodiment, in addition to the effects achieved by the display panel apparatuses 5 to 7 according to the fifth to seventh embodiments, it is possible to prevent the lens resin material and the partition resin material from being mixed in the manufacturing process. This facilitates manufacturing the display panel apparatus with high light-extraction efficiency and high contrast.

Figure 23:
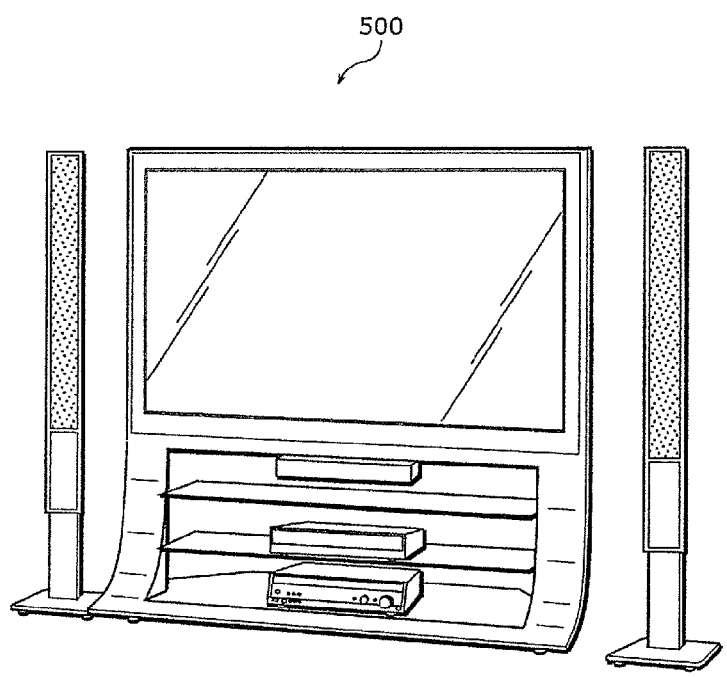
FIG. 23 is an external view of the display apparatus according to the embodiments of the present invention in which the display panel apparatus is embedded.

The display panel apparatuses according to the embodiments of the present invention have been described above. The display panel apparatus in each embodiment can be used as a flat-panel display, for example. For example, the display panel apparatus can be applied to any display apparatus such as a television set 500 as illustrated in FIG. 23, mobile phone, or personal computer.

Although only some exemplary embodiments of the display panel apparatus and the manufacturing method of the display panel apparatus according to the present invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The display panel apparatus according to the present invention can be used as any display apparatus in television sets, mobile phones, and personal computers.

What is claimed is:

1. A display panel apparatus, comprising:
a substrate;
an organic electro-luminescence unit including an array above the substrate including a first pixel that emits a red light, a second pixel that emits a green light, and a third pixel that emits a blue light;
a glass layer above the organic electro-luminescence unit;
a resin layer between the glass layer and the organic electro-luminescence unit, a first surface of the resin layer on a side toward the organic electro-luminescence unit including concaves, each of the concaves being concaved toward the glass layer and corresponding to one of the first pixel, the second pixel, and the third pixel; and
lens resins, each in one of the concaves and including a second surface that is substantially coplanar with the first surface of the resin layer that is on the side toward the organic electro-luminescence unit,
wherein a first refractive index of a first lens resin of the lens resins that is in a first concave of the concaves that corresponds to the third pixel is greater than at least a second refractive index of a second lens resin of the lens resins that is in a second concave of the concaves that corresponds to the first pixel.

2. The display panel apparatus according to claim 1, further comprising:
a second resin layer between the organic electro-luminescence unit and the resin layer for bonding the organic electro-luminescence unit and the resin layer,
wherein the second surface of the lens resins is coplanar with a third surface of the second resin layer that is bonded with the resin layer and the lens resins protrude toward the glass layer from the third surface of the second resin layer.

3. The display panel apparatus according to claim 2, wherein a third refractive index of a third lens resin of the lens resins that is in a third concave of the concaves that corresponds to the second pixel is greater than the second refractive index of the second lens resin that is in the second concave that corresponds to the first pixel.

4. The display panel apparatus according to claim 3, wherein the first refractive index of the first lens resin that is in the first concave that corresponds to the third pixel is approximately equal to the third refractive index of the third lens resin that is in the third concave that corresponds to the second pixel.

5. The display panel apparatus according to claim 2, further comprising:
a sealing layer between the organic electro-luminescence unit and the second resin layer for sealing the first pixel, the second pixel, and the third pixel.

6. The display panel apparatus according to claim 2, wherein each of the concaves is elongated in a top view and has an elliptic arc shape with a predetermined curvature factor in a cross-section orthogonal to a longitudinal direction of the lens.

7. The display panel apparatus according to claim 1, wherein refractive indices of the lens resins in the concaves are at least equal to a third refractive index of the resin layer.

8. The display panel apparatus according to claim 7, wherein the third refractive index of the resin layer is at least 1.3 and at most 1.5,
the second refractive index of the second lens resin in the second concave that corresponds to the first pixel is approximately 1.5,
a fourth refractive index of a third lens resin of the lens resins that is in a third concave of the concaves that corresponds to the second pixel is approximately 1.9, and
the first refractive index of the first lens resin that is in the first concave that corresponds to the third pixel is approximately 1.9.

9. The display panel apparatus according to claim 1, wherein the lens resins contact a lower surface of the glass layer.

10. The display panel apparatus according to claim 1, wherein the resin layer further includes a second concave between two of the concaves, the second concave being concaved toward the glass layer, and
a black partition is in the second concave and includes a third surface that is substantially coplanar with the first surface of the resin layer that is on the side toward the organic electro-luminescence unit.

11. The display panel apparatus according to claim 10, wherein a first depth of the second concave is at least equal to a second depth of the concaves.

12. The display panel apparatus according to claim 1, wherein one of the substrate and the organic electro-luminescence unit includes an alignment mark for aligning the substrate and the concaves,
the resin layer further includes a recess along a perimeter of the concaves and protruding toward the organic electro-luminescence unit, and
the recess is in alignment with the alignment mark.

13. The display panel apparatus according to claim 1, wherein the glass layer comprises an outer surface of the display panel apparatus.

14. A display apparatus, comprising:
the play panel apparatus according to claim 1,
wherein the first pixel, the second pixel, and the third pixel are in a matrix.

15. A display panel apparatus, comprising:
an organic electro-luminescence unit including an array of a first pixel that emits a red light, a second pixel that emits a green light, and a third pixel that emits a blue light;
a glass layer, a first surface of the glass layer on a side toward the organic electro-luminescence unit including concaves, each of the concaves being concaved in the glass layer away from the organic electro-luminescence unit and corresponding to one of the first pixel, the second pixel, and the third pixel; and
lens resins, each in one of the concaves and including a second surface that is substantially coplanar with the first surface of the glass layer that is on the side toward the organic electro-luminescence unit,
wherein a first refractive index of a first lens resin of the lens resins that is in a first concave of the concaves that corresponds to the third pixel is greater than at least a second refractive index of a second lens resin of the lens resins that is in a second concave of the concaves that corresponds to the first pixel.

* * * * *